United States Patent [19]
Inoue

[11] Patent Number: 5,391,235
[45] Date of Patent: Feb. 21, 1995

[54] SOLAR CELL MODULE AND METHOD OF MANUFACTURING THE SAME

[75] Inventor: Yuji Inoue, Nagahama, Japan

[73] Assignee: Canon Kabushiki Kaisha, Tokyo, Japan

[21] Appl. No.: 35,623

[22] Filed: Mar. 23, 1993

[30] Foreign Application Priority Data

Mar. 31, 1992 [JP] Japan .................. 4-077445

[51] Int. Cl.⁶ .................. H01L 31/05; H01L 31/18
[52] U.S. Cl. .................. 136/244; 437/2
[58] Field of Search .......... 136/244; 437/2-5, 437/51, 205

[56] References Cited

U.S. PATENT DOCUMENTS

| | | | |
|---|---|---|---|
| 3,094,439 | 6/1963 | Mann et al. | 136/244 |
| 3,553,030 | 1/1971 | Lebron | 136/244 |
| 4,430,519 | 2/1984 | Young | 136/244 |
| 4,605,813 | 8/1986 | Takeuchi et al. | 136/244 |
| 4,617,420 | 10/1986 | Dilts et al. | 136/244 |

FOREIGN PATENT DOCUMENTS 58-56368 4/1983 Japan .................. 136/244

Primary Examiner—Aaron Weisstuch
Attorney, Agent, or Firm—Fitzpatrick, Cella, Harper & Scinto

[57] ABSTRACT

A solar cell module having a plurality of solar cells formed on corresponding substrates, connection members for series electrically connecting each of the electrodes of the solar cell to an opposite polarity electrode of an adjacent solar cell, wherein the connection member is in the form of an elongated shape having a laminated structure composed of an insulating member and a conductive member.

17 Claims, 29 Drawing Sheets

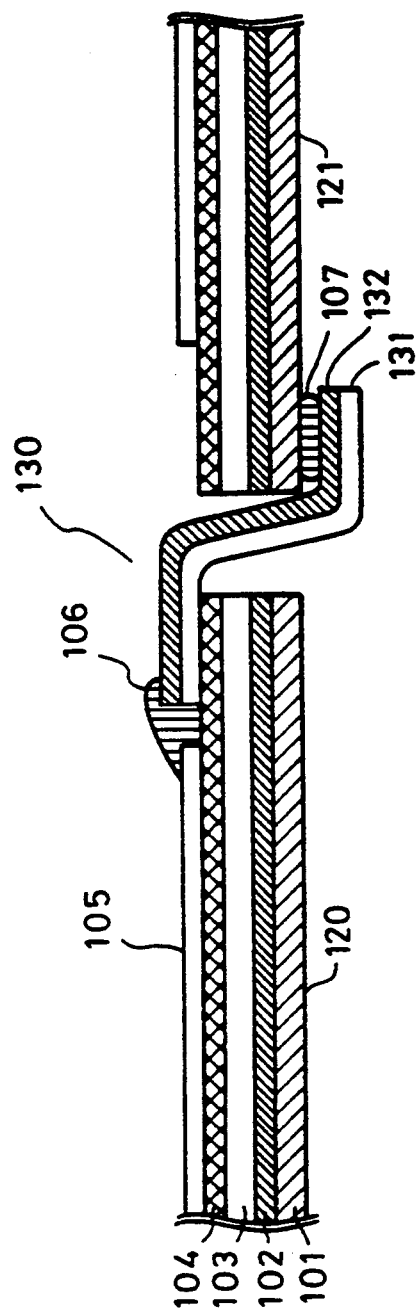

130

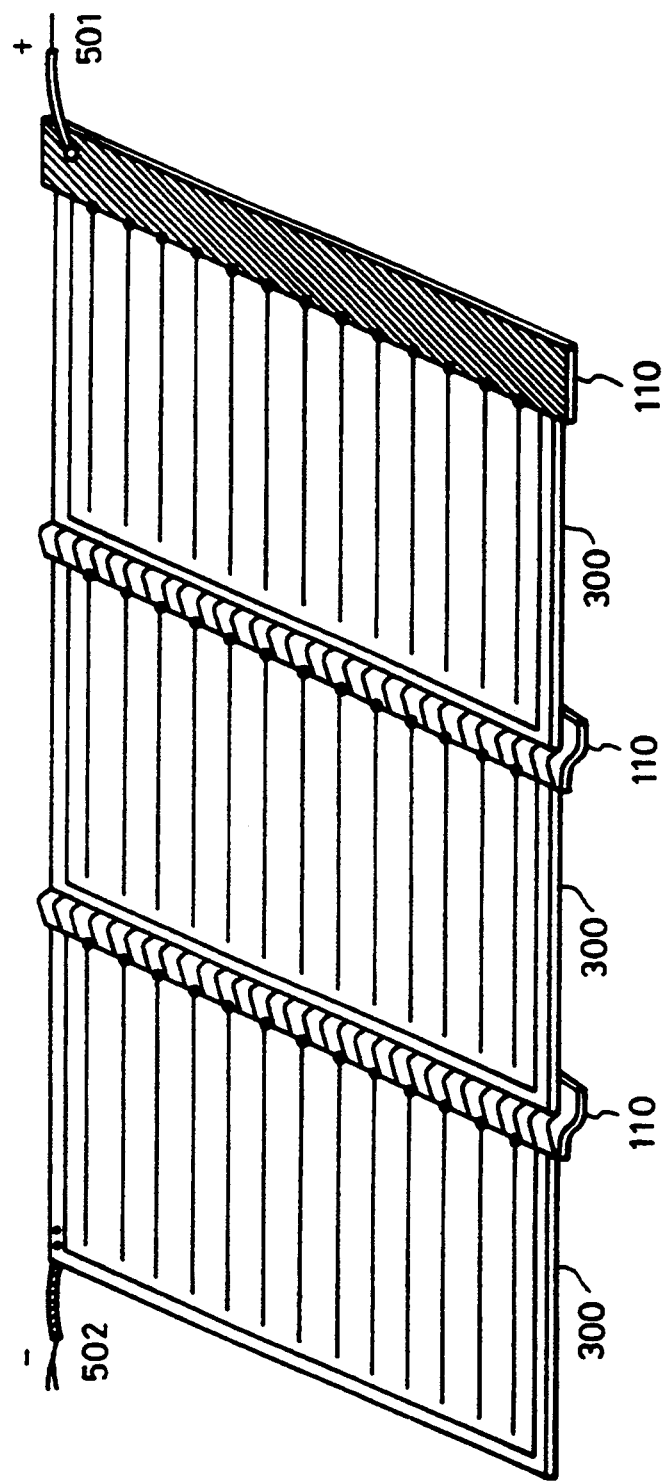

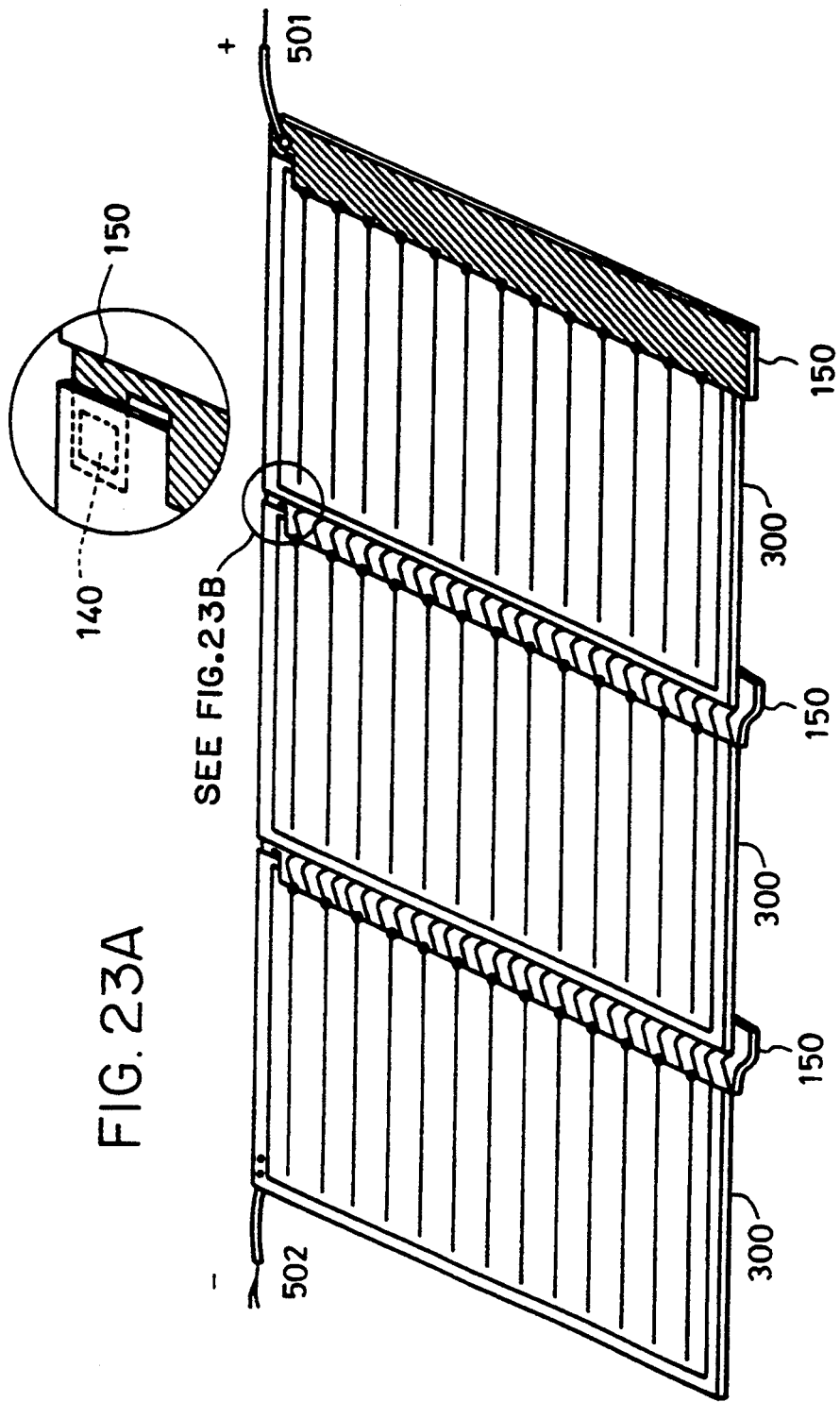

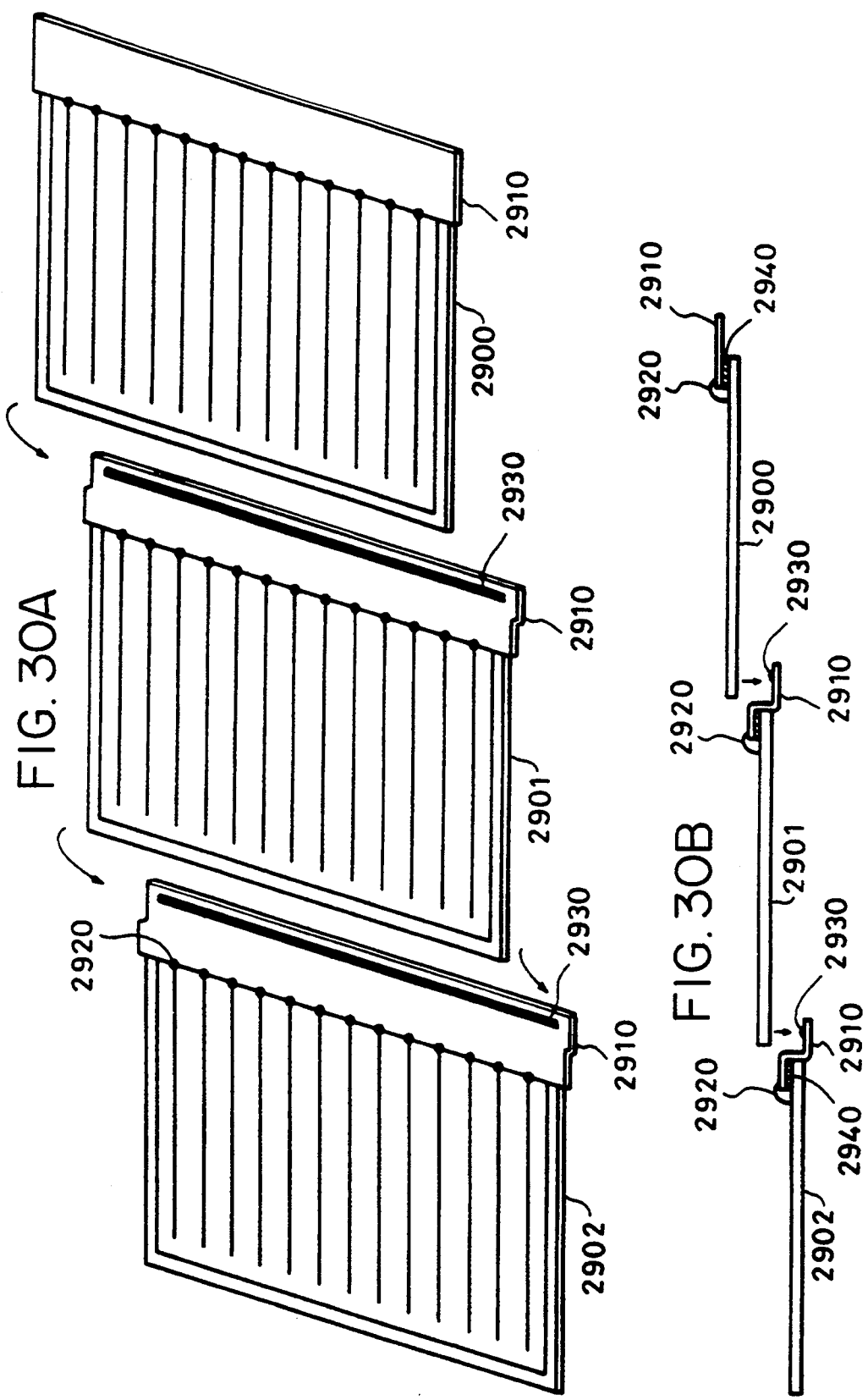

FIG. 31A
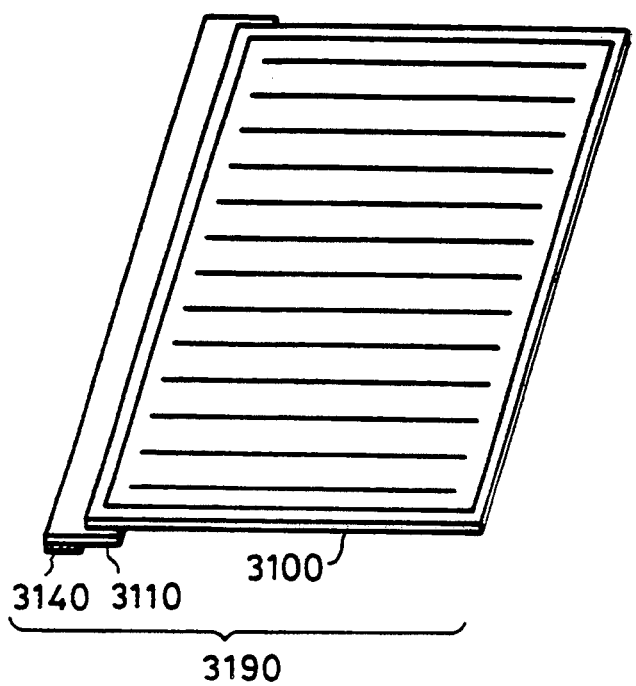
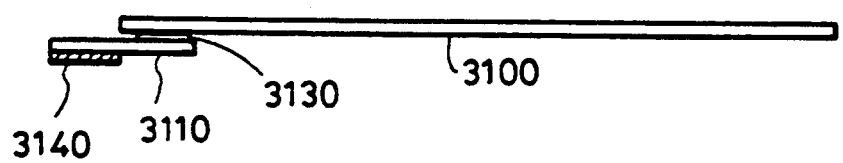
FIG. 31B

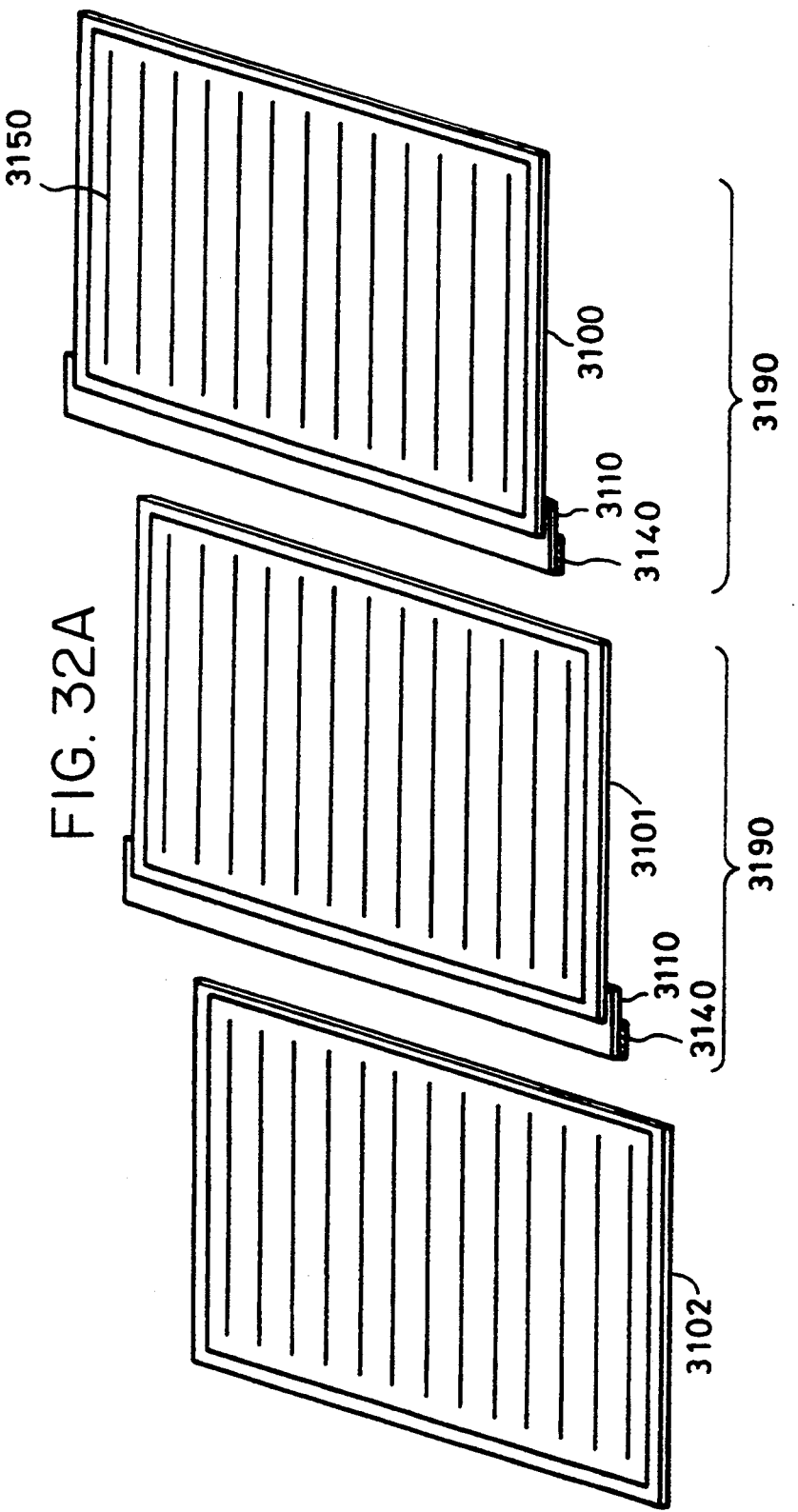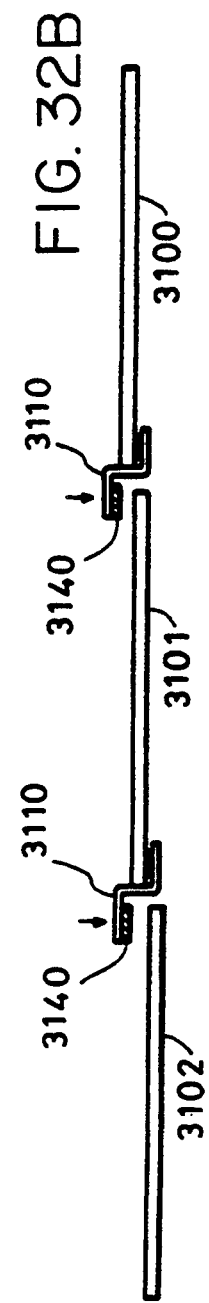

SOLAR CELL MODULE AND METHOD OF MANUFACTURING THE SAME

BACKGROUND OF THE INVENTION

1. Field of the Invention

The present invention relates to a solar cell module constituted by connecting a plurality of solar cell elements in series or in parallel, particularly to a reliable solar cell module exhibiting excellent conversion efficiency.

2. Related Art

It has recently been predicted that the earth will be warmed due to the greenhouse effect caused by an increase in $CO_2$ and the like. Therefore, a desire for clean energy from which $CO_2$ and the like are not produced has arisen.

Nuclear power generation has caused another unsolved problem of radioactive waste, further giving rise to a desire for a source of clean energy.

Solar cells are particularly attractive due to their cleanliness and handling facility.

In particular, amorphous silicon solar cells and polycrystal silicon solar cells have been energetically researched amongst various solar cells because they can be manufactured in a large area at a low cost.

Since, from a practical point of view, a voltage of tens of volts is required, the upper electrodes and the lower electrodes of adjacent solar cell elements must be connected in series.

If shock resistance or flexibility is required, for example, the solar cell substrate may be a conductive one made of stainless steel.

FIGS. 10 and 11 are schematic views which illustrate a conventional series-connected solar cell module constituted by connecting a plurality of solar cell elements by means of wiring members.

Referring to FIGS. 10 and 11, reference numerals 200a and 200b represent conductive substrates, 201a and 201b represent semiconductor layers, 203a and 203b represent upper electrodes, 204a and 204b represent current collecting electrodes, 205a and 205b represent wiring connection members and 206 and 207 represent solar cell elements. Reference numeral 208 represents a solar cell similarly constituted.

The solar cell element 206 is manufactured by sequentially forming the lower electrode 201a, the semiconductor layer 202a, and the upper electrode 203a. Then, the conductive substrate 200a of the solar cell element 206 and the current-collecting electrode 204b of the adjacent solar cell element 207 are electrically connected to each other using the wiring connection member 205a. Furthermore, the adjacent solar cell element 208 and the solar cell element 207 are connected in series.

Since the connection members used to establish the series connection are usually made of metal, a short-circuit may occur because the upper electrode 203a can be separated even if it comes in contact with the connection member 205a. Even if they do not come in contact with each other, another problem arises because the electric current cannot easily flow laterally. Because the lower electrode is made of metal, it is necessary that contact between the aforesaid connection member 205a and the lower electrode 201b of the solar cell element 207 be prevented. Furthermore, contact between, for example, the lower electrodes 201a and 201b of the adjacent solar cell elements 206 and 207 must be prevented. Therefore, the distance between the solar cell elements 206 and 207 must be lengthened. However, this causes the problem that the effective area of the generating region of the solar cell module decreases and the conversion efficiency deteriorates.

If the solar cell module is accidentally bent during use, stress inevitably acts on the connection members disposed between the adjacent solar cell elements, causing the solar cell elements and the series connection members to be short-circuited. As a result, the quality deteriorates and, when the solar cell module is repeatedly bent, the connection member breaks if a thin connection member is used or if the connection member is connected to only a portion of the solar cell.

What is worse, a portion of the connection member used to establish the series connection and appearing on the surface of the solar cell module covers the light-receiving surface of the solar cell element, causing the aforesaid portion to be a non-generating region. In order to reduce the area of the non-generating region, a comb-shaped connection member 210 arranged as shown in FIG. 12 may be employed in place of the connection members 205a and 205b to establish the series connection. However, if the comb-shaped connection member has poor strength, the connection member is broken if the solar cell module having the solar cell elements connected in series by using the aforesaid connection member is repeatedly bent.

If a thick connection member is employed in order to prevent the aforesaid problem, another problem arises in that a thick connection member made of metal such as copper is too strong and causes damage to the surface of the solar cell element at the metal edge portion thereof.

Where the solar cells are connected in series, breakage of the solar cells due to application of a reverse bias voltage must be prevented. If light incident on one cell element of a solar cell module constituted of four solar cell elements connected in series is shielded, the solar cell element cannot generate photovoltaic force, thereby causing the sum of the output voltages of the other solar cell elements to be supplied to the shielded solar cell, as a reverse bias voltage. Therefore, there is a risk that the solar cell element can be electrically destroyed.

In order to prevent application of the reverse bias voltage, a reverse bias prevention bypass diode must be disposed parallel to each solar cell element.

FIG. 13 is a schematic view which illustrates a conventional structure constituted by connecting three solar cell elements in series and reverse bias voltage prevention bypass diode 230 is connected to the upper and lower electrodes of each of the solar cell elements. FIG. 14 is a cross-sectional view taken along line X—X' of FIG. 13.

Referring to FIGS. 13 and 15, reference numerals 240, 241, and 242 represent solar cell elements, each of which is constituted by sequentially forming lower electrode 251, semiconductor layer 252, and upper electrode 253 on conductive substrate 250.

Each of the solar cell elements is constituted by forming comb-shaped electrode 214 as a current-collecting electrode on the upper electrode 253, with bus bar 215, serving as the current-collecting electrode for the comb-shaped electrode 214, placed on the comb-shaped electrode 214. The comb-shaped electrode 214 and the bus bar 215 are electrically connected to each other by conductive adhesive agent 216 so that an output terminal from the upper electrode 253 is formed.

The electrical output can be obtained by connecting portion 220 of the conductive substrate of the solar element 240 to conductive member 219 made of copper, for example, by spot welding or the like.

Then, the bus bar 215 of the solar cell element 240 and the conductive member 219 connected to the conductive substrate of the adjacent solar cell element 241 are connected to each other, so that a series connection is established. Then, a reverse bias voltage prevention bypass diode is disposed between the bus bar 215 of each of the solar cell elements and the conductive member 219 connected to the conductive substrate as by soldering.

However, the aforesaid arrangement wherein a reverse bias voltage prevention bypass diode is connected to each of the solar cell elements requires the reverse bias voltage prevention bypass diode to be positioned apart from each solar cell element. As a result, the ratio of the effective generating area to the overall area of the solar cell module decreases.

The reverse bias voltage prevention bypass diode of ordinary type is molded with resin and has a lead wire (a leg) for connection thereto by soldering, which may result in wire breakage. Therefore, the reverse bias voltage prevention bypass diode must be of a relatively large size, resulting in a portion of the reverse bias voltage prevention bypass diode projecting over the surface of the solar cell element when an encapsulant such as an EVA (ethylene-vinyl acetate copolymer) encloses the solar cell element in the ensuing manufacturing process. As a result, the flatness of the solar cell module deteriorates, and bubbles are easily left at positions adjacent to the reverse bias voltage prevention bypass diode. The laminated member is then easily separated from the solar cell element starting from the bubble portion during outdoor use of the solar cell module.

Even more detrimental, a large quantity of the encapsulant must be used in order to improve the flatness of the solar cell module, and therefore, there is no reduction possible in the overall cost.

The aforesaid conventional solar cell module cannot easily be manufactured and, therefore, the manufacturing process cannot be automated.

SUMMARY OF THE INVENTION

An object of the present invention is to provide a solar cell module comprising: a plurality of solar cells formed on respective substrates, wherein each of said solar cells has at least two electrodes; connection members for series electrically connecting either of the electrodes of the solar cell to an opposite polarity electrode of an adjacent solar cell, wherein the connection member is in the form of an elongated shape having a laminated structure composed of an insulating member and a conductive member.

Another object of the present invention is to provide a solar cell module whereby the connection member is positioned on a transparent electrode of the solar cell. The insulating member is disposed on the transparent electrode and the conductive member is disposed on the insulating member.

Another object of the present invention is to provide a solar cell module having a current-collecting electrode disposed on the transparent electrode and in which the current-collecting electrode and the conductive member of the connection member are electrically connected to each other.

Another object of the present invention is to provide a solar cell module wherein the solar cells comprise a thin film semiconductor.

Another object of the present invention is to provide a solar cell module wherein the insulating member is light transmissive and the conductive member has a comb shape.

Another object of the present invention is to provide a solar cell wherein the current-collecting electrode and a portion of the conductive member having the comb shape are electrically connected to each other.

Another object of the present invention is to provide a solar cell module wherein a portion of the connection member has a reverse bias voltage prevention bypass diode.

Another object of the present invention is to provide a solar cell module wherein the conductive member has a volume resistivity of $1 \times 10^{-4}$ $\Omega$.cm or less.

Another object of the present invention is to provide a solar cell module wherein the insulating member has a volume resistivity of $1 \times 10^x$ $\Omega$.cm or more.

Another object of the present invention is to provide a solar cell module wherein the insulating member has a light transmissivity of 50% or more with respect to visible light.

Another object of the present invention is to provide a solar cell module wherein the insulating member has a thickness of from $20\mu$ to $200\mu$.

Another object of the present invention is to provide a solar cell module wherein the insulating member is made of a material selected from a group consisting of polyester, polyimide, polyethylene, nylon, polymethacrylate, polycarbonate, polyethylene terephthalate, polyamide, polystyrene, and fluorine-containing resin.

Another object of the present invention is to provide a solar cell module wherein the substrate forms one of the electrodes of the solar cell, and said substrate is conductive.

Another object of the present invention is to provide a solar cell module wherein the substrate is made of a sheet material selected from a group consisting of stainless steel, aluminum, copper, and carbon.

Another object of the present invention is to provide a solar cell module wherein the substrate has a nickel-plated portion and the nickel-plated portion and the conductive member are electrically connected to each other.

Another object of the present invention is to provide a solar cell module wherein a thermosetting adhesive agent is applied between the insulating member and the conductive member.

Another object of the present invention is to provide a solar cell module wherein the reverse bias voltage prevention bypass diode is a bare chip diode.

Another object of the present invention is to provide a solar cell module wherein the diode portion and the series connection portion are separated from each other by a cut portion of the connection member.

Another object of the present invention is to provide a method of manufacturing a solar cell module comprising the manufacturing steps of: electrically connecting an elongated connection member having a laminated structure composed of a conductive member and an insulating member to one electrode of a solar cell, so as to be sub-assembled; and sequentially stacking the sub-assembled connection members of the solar cells on the unconnected electrodes of adjacent solar cells.

Other objects, features, and advantages of the invention will be more fully apparent from the following description.

BRIEF DESCRIPTION OF THE DRAWINGS

FIG. 4 is a schematic cross sectional view which illustrates the second embodiment of the solar cell module according to the present invention;

FIG. 18 is a schematic view which illustrates the fourth embodiment of the solar cell module according to the present invention;

FIG. 23 is a schematic view which illustrates the seventh embodiment of the solar cell module according to the present invention;

FIGS. 30a and 30b illustrate a method of manufacturing the solar cell module according to the present invention;

FIGS. 31a and 31b are schematic views which illustrate a sub-assembly of another example of the connection member and the solar cell according to the present invention; and FIGS. 32a and 32b illustrate another method of manufacturing the solar cell module according to the present invention.

DETAILED DESCRIPTION OF THE INVENTION

Figure 1:
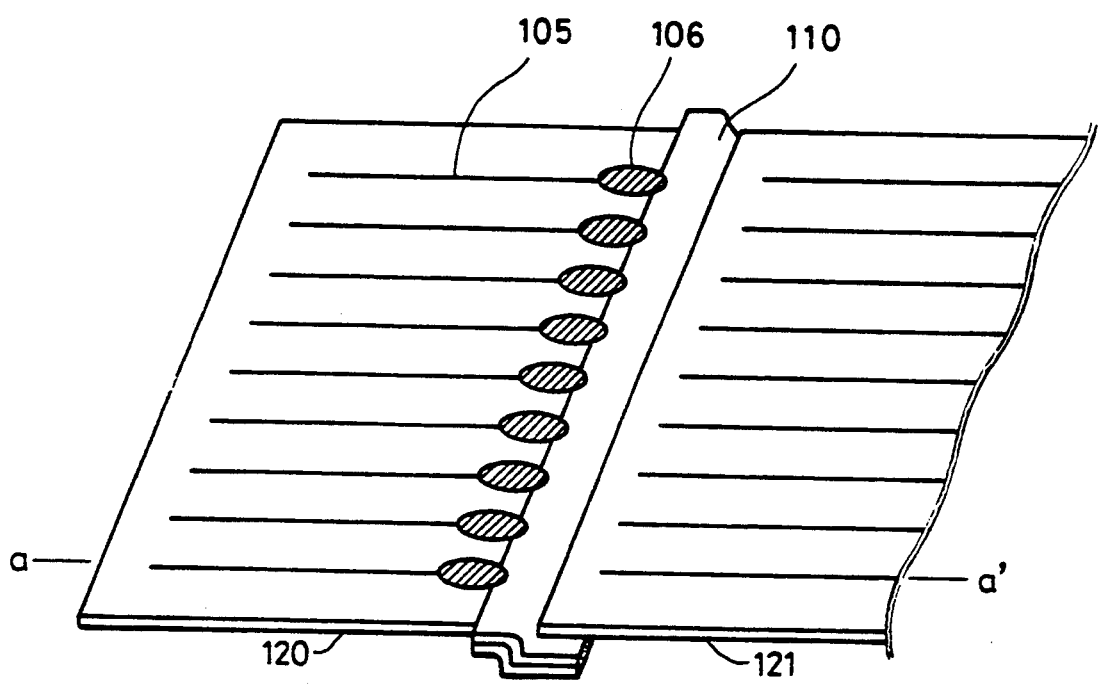
FIG. 1 is a schematic view which illustrates a first embodiment of a solar cell module according to the present invention.

An object of the present invention is to provide a solar cell module in which the area of the non-generating region can be reduced, which exhibits excellent conversion efficiency and durability, and which can be easily manufactured, thereby resulting in cost reduction.

According to the present invention, the area of the non-generating region in the solar cell module can be reduced, thereby improving the conversion efficiency of the solar cell module.

Even if the solar cell module is repeatedly bent, the connection member is freed from breakage because electrical connection according to the invention is employed. Therefore, reliability can be maintained for a long time.

Since the electrical connection of the invention is employed, the solar cell element cannot be damaged even if a thick conductive connection member is employed. Therefore, the manufacturing yield can be improved, resulting in cost reduction.

Further, electrical short-circuit can be prevented between the conductive member of the series connection member and the lower electrode of the solar cell device having the current-collecting electrode to which the conductive member of the connection member is connected. Moreover, the lower electrodes or the conductive substrates of the solar cell element do not short-circuit. Therefore, the need for positioning the solar cell elements away from each other can be eliminated, and the non-generating region in the solar cell module can be reduced. As a result, the conversion efficiency of the solar cell module can be improved.

Since short-circuits between the solar cell elements taking place because the solar cell module is bent or due to the expansion/contraction of the solar cell module caused by the temperature changes during use of the solar cell module can be prevented, the reliability of the solar cell module can be maintained for a long time.

Further, electric power loss due to loss of current can be prevented because the connection member collects electric currents from the collecting electrode due to the arrangement that the series connection member comprises an elongated insulating member and the conductive member.

In addition, the structure is arranged such that the connection member comprises the transparent insulating member and the comb-shaped conductive member strengthens the connection member and increases the light receiving portion of the semiconductor. As a result, the reliability of the solar cell module can be improved and the conversion efficiency can be improved.

Further, the arrangement is made such that electrical short-circuits which occur between the conductive member of the connection member and the lower electrode of the solar cell element having the current collection electrode to which the conductive member of the connection member is connected can be prevented. Additionally, short-circuits which occur between the conductive substrates of the solar cell elements are prevented, thereby facilitating automation. Therefore, a cost-effective solar cell module can be provided.

In addition, the ratio of the effective generating area with respect to the overall area of the solar cell module can be increased because the necessity of positioning the reverse bias voltage prevention bypass diode away from each solar cell element can be eliminated.

Because of the connection member comprising a chip-type reverse bias voltage prevention bypass diode, the elongated insulating member, and the conductive member, the projection of the solar cell module due to the presence of the reverse bias voltage prevention bypass diode can be prevented. Further, the problem of bubbles in the encapsulant adjacent to the reverse bias voltage prevention bypass diode can be prevented, thereby maintaining the reliability of the solar cell module for a long time. Moreover, wire breakage can be prevented, thereby improving reliability. The material cost and manufacturing process time for establishing the connection can be reduced because wiring for connecting the reverse bias voltage prevention bypass diode and each solar cell element to each other can be omitted from the structure.

By constituting the connection member by the insulating member and the conductive member, the connection member can be strengthened, and the characteristics of the solar cell module can be stably exhibited even if the temperature and the humidity are changed (temperature and humidity cycle).

Further, the connection member comprising the reverse bias voltage prevention bypass diode, the insulating member and the conductive member can be formed into a sub-assembly, enabling the manufacturing process and its automation to be simplified. Therefore, a cost-efficient solar cell module can be obtained.

Embodiment 1

A first embodiment of the present invention will now be described with reference to the drawings.

Figure 2:
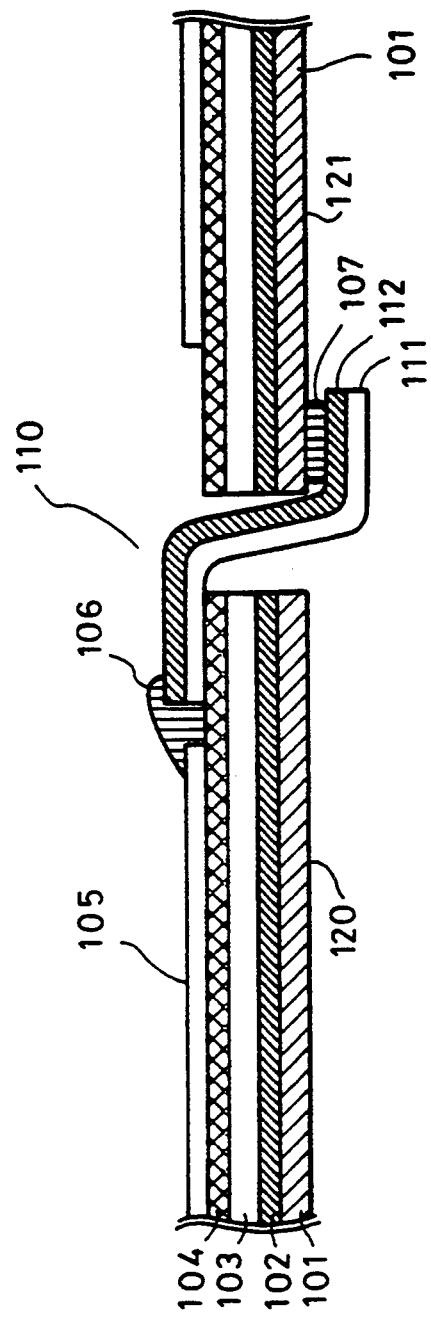
FIG. 2 is a schematic cross-sectional view which illustrates the first embodiment of the solar cell module according to the present invention.

FIG. 1 and 2 are schematic views which illustrate an example of a solar cell module according to the present invention.

FIG. 2 is a cross-sectional schematic view which illustrates a solar cell module, constituted by series connecting a plurality of solar cell elements, in each of which lower electrode layer 102, semiconductor layer 103, upper electrode layer 104, and comb-shaped electrode 105, serving as the current-collecting electrode of the upper electrode layer 104, are formed on a conductive substrate 101. Furthermore, the plurality of solar cell elements are connected in series using a connection member 110 comprising insulating member 111 and conductive member 112.

The current-collecting electrode 105 of the upper electrode 104 of solar cell element 120 and the connection member 110 comprising the insulating member and the conductive member are electrically connected to each other by a conductive adhesive agent 106. Further, the conductive substrate 101 of the solar cell element 121 and the conductive member 112 of the connection member 110 comprising the insulating member 111 and the conductive member 112 are electrically connected to each other by a conductive adhesive agent 107.

The conductive member 112 of the connection member 110 comprising the insulating member 111 and the conductive member 112 according to the present invention must have a volume resistivity of $1 \times 10^{-2}$ $\Omega$.cm or less. It is preferable that the conductive member 112 be made of, for example, a metal having a volume resistivity of $1 \times 10^{-4}$ $\Omega$.cm or less, for example, metal foil made of copper, gold, silver, aluminum, tin, or solder.

The insulating member 111 of the connection member 110 comprising the insulating member 111 and the conductive member 112 and according to the present invention must have a volume resistivity of $1 \times 10^{8}$ $\Omega$.cm or more, preferably $1 \times 10^{10}$ $\Omega$.cm or more. For example, polymer resin having flexibility and exemplified by polyester, polyimide, denatured epoxy resin or an inorganic material such as nonwoven glass fabric may be employed.

The connection member 110 according to the present invention comprising the insulating member 111 and the conductive member 112 can be manufactured by bonding the insulating member 111 and the conductive member 112 with an epoxy or acrylic adhesive agent while heating or pressing them together.

The conductive adhesive agent for electrically connecting the conductive member 112 of the connection member 110 according to the present invention and comprising the insulating member 111 and the conductive member 112 to the current-collecting electrode 105 of the solar cell element may be arbitrarily selected from a group consisting of, for example, silver paste and solder.

If solder is employed to established the connection, it is preferred that the surfaces of the conductive substrate 101 and the conductive member 112 of the connection member 110 be previously treated so as to be easily connected by the solder. The treatment is exemplified by nickel, tin, solder, or copper plating, etching, and mechanical roughening.

The conductive substrate of the solar cell element according to the present invention may be made of a sheet of stainless steel, aluminum, copper, or carbon. The lower electrode formed on the substrate according to the present invention may be made of Ti, Cr, Mo, W, Al, Ag, or Ni and manufactured by a method such as a resistance heating evaporation method, an electron beam evaporation method, and a sputtering method. However, there is no particular limitation.

The photovoltaic layer of the solar cell element according to the present invention may be made of a known semiconductor material. The semiconductor layer of the solar cell element according to the present invention may be a pin junction amorphous silicon type layer, a pn junction polycrystal silicon layer, or a $CuInSe_2/CdS$ layer. The semiconductor layer can be formed by a plasma CVD method if the amorphous silicon type layer is employed, the plasma CVD method being a method in which plasma discharge is generated in raw material gas such as a silane gas from which the semiconductor thin film is formed. The pm junction polycrystal silicon layer can be formed from molten silicon by, for example, a liquid layer growth method or a coating method. The $CuInSe_2/CdS$ layer can be formed by an electron beam evaporation method, a sputtering method, or an electrodeposition method (electrolytic deposition from an electrolyte).

The material for forming the upper electrode of the solar cell element according to the present invention is exemplified by $In_2O_3$, $SnO_2$, $In_2O_3$—$SnO_2$, $ZnO$, $TiO_2$, $Cd_2SnO_4$, and a crystalline semiconductor material in which impurities are doped at a high concentration. The forming method is exemplified by a resistance heating evaporation method, an electron beam evaporation method, a sputtering method, a spraying method, a CVD method, and an impurity diffusion method. However, the present invention is not limited to the aforesaid methods.

The comb-shaped electrode according to the present invention may be made of a material having a conductivity higher than that of the aforesaid copper electrode. For example, it may be a metal electrode or a conductive electrode in which metal and polymer binder are dispersed. In general, metal paste is used, in which metal powder and polymeric resin binder are formed into a paste. The metal paste is usually formed on a transparent electrode by a screen printing method, the transparent electrode being the upper electrode. In order to obtain a desired conductivity, it is preferred that the metal paste be silver paste, copper paste, gold paste, nickel paste, or aluminum paste. However, the present invention is not limited to them.

In order to decrease the resistance value, a multilayer structure may be employed in which metal such as solder or copper is formed by a plating method on the comb-shaped electrode formed by the conductive paste.

Embodiment 2

Figure 3:
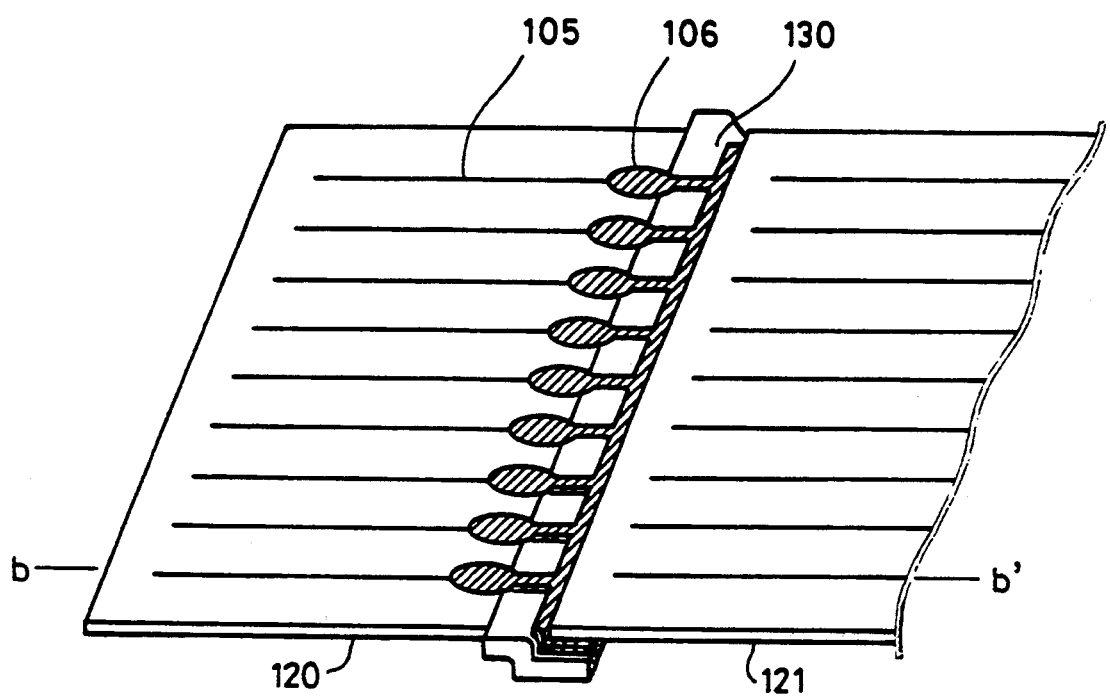
FIG. 3 is a schematic view which illustrates a second embodiment of the solar cell module according to the present invention.
Figure 5A:
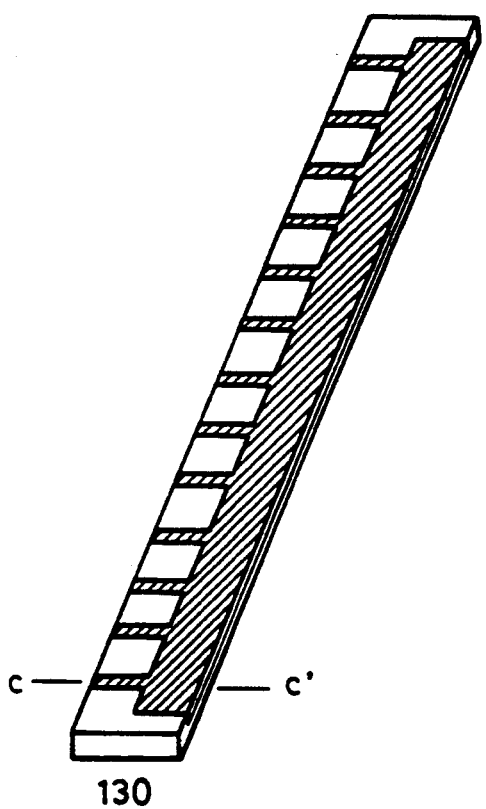
FIGS. 5a and 5b are a schematic view and a cross-sectional view, respectively, which illustrate a connection member according to the second embodiment of the present invention.
Figure 5B:
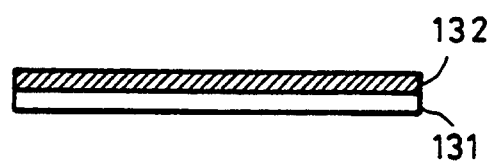

FIGS. 3, 4, and 5 are schematic views which illustrate a second embodiment of the solar cell module according to the present invention.

FIGS. 3 and 4 are schematic views which illustrate the solar cell module, constituted by series connecting a plurality of solar cell elements, in each of which lower electrode layer 102, semiconductor layer 103, upper electrode layer 104, and comb-shaped electrode 105, serving as the current-collecting electrode of the upper electrode layer 104, are formed on conductive substrate 101. Further, the plurality of solar cell elements are connected in series by using connection member 130, comprising insulating member 131 having light transmissivity and conductive member 132 having a comb shape.

The current-collecting electrode 105 of the upper electrode 104 of solar cell element 120 and the connection member 130 are electrically connected to each other by conductive adhesive agent 106. Furthermore, the conductive substrate 101 of the solar cell element 121 and the conductive member 132 of the connection member 130 are electrically connected to each other by conductive adhesive agent 107.

The conductive member 132 of the connection member 130 comprising the insulating member 131 and the conductive member 132 according to the present invention must have a volume resistivity of $1 \times 10^{-2}$ $\Omega$.cm or less. It is preferable that the conductive member 132 be made of, for example, metal having a volume resistivity of $1 \times 10^{-4}$ $\Omega$.cm or less, for example, metal foil made of copper, gold, silver, aluminum, tin, or solder. Referring to FIG. 5, the pattern of the conductive member 132 having the comb shape is arranged to fit the current-collecting electrode 105. The pattern can be formed by a photolithographic method in which an etching solution is used or by a punch press method.

The conductive member 132 of the connection member 130 comprising the insulating member 131 having the light transmissivity and the conductive member 132 having the comb shape according to the present invention must have a volume resistivity of $1 \times 10^8$ $\Omega$.cm or more. It is preferable that the insulating member 131 be made of, for example, an insulating material having a volume resistivity of $1 \times 10^{10}$ $\Omega$.cm or less and light transmissivity. The light transmissivity in the visible light region (400 to 700 nm) must be at least 30% or more, preferably at least 50%. The material is exemplified by polyester, polyimide, polyethylene, nylon, polymethacrylate, polycarbonate, polyethylene terephthalate, polyamide, polystyrene, and fluorine-containing resin. However, the present invention is not limited to the aforesaid materials.

The thickness of the insulating member 131 according to the present invention must be $20\mu$ or more if it is repeatedly bent, and preferably less than $200\mu$. Since the electric current which can be outputted from the solar cell is a large current (hundreds of mA to tens of A), unlike the small current (several $\mu$A to several mA) which flows in electronic equipment, a thick conductive member must be used in the connection member of the solar cell. Therefore, the conductive member sometimes has burrs or the like at the end portion thereof. If the thickness of the conductive member is less than $20\mu$, the burrs present at the end portion of the conductive member can damage the surface of the solar cell element, causing a short-circuit between the upper electrode and the lower electrode of the solar cell. As a result, the conversion efficiency deteriorates. If the thickness of the insulating member is $200\mu$ or more, the connection member becomes stiff and loses flexibility. Therefore, if the solar cell is repeatedly bent, the connection member is undesirably separated from the surface of the solar cell element or the substrate of the solar cell due to the stiffness of the connection member.

Figure 28:
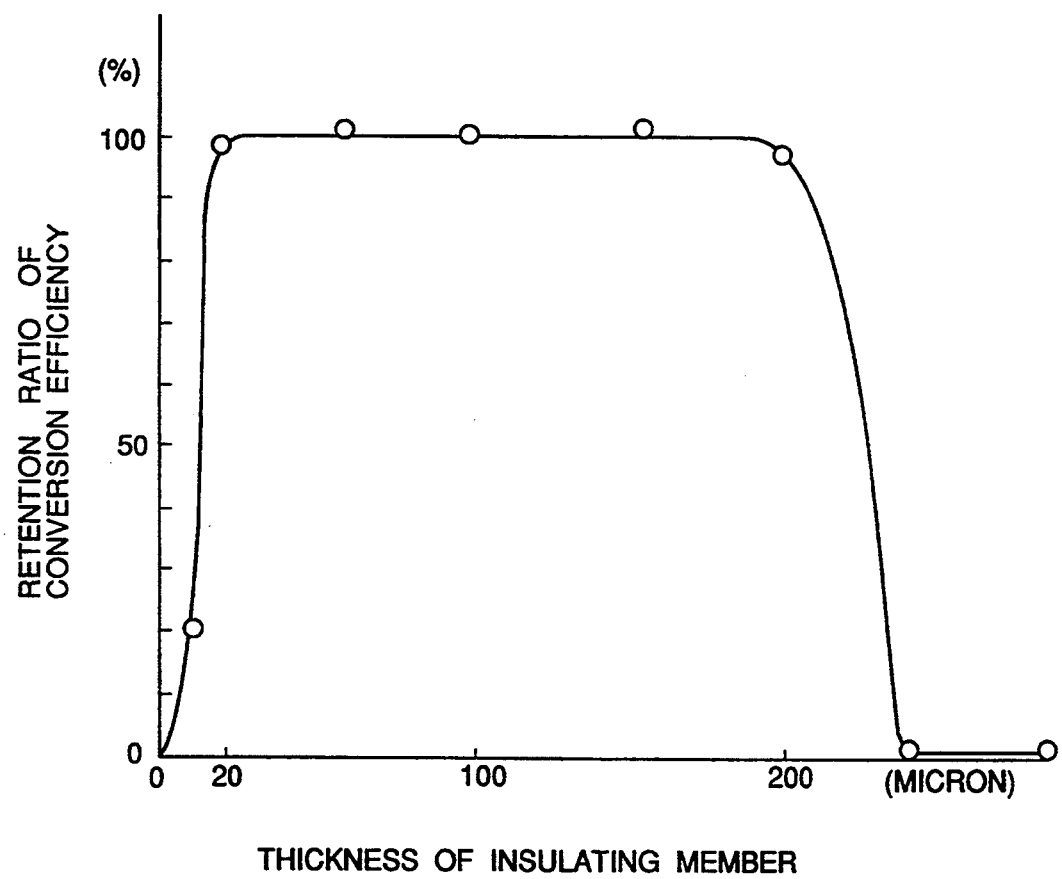
FIG. 28 is a graph which illustrates the relationship between changes of the conversion efficiency and thicknesses of the insulating member when the solar cell module is repeatedly bent.

FIG. 28 is a graph which plots the retention ratio of the conversion efficiency of the solar cell module as a function of the thickness of the insulating member after the solar cell module has been repeatedly bent 50 times, the solar cell module being formed by series connecting solar cell elements, in which each of the lower electrodes, the amorphous type semiconductor, the upper electrodes, and the current-collecting electrodes of the upper electrodes are formed on a stainless steel substrate, and which are connected in series by using a connection member comprising the insulating member and the conductive member. The insulating member is made of a polyimide film and the conductive member is made of 100μ-thick copper. The conversion efficiency was evaluated in the case where the thickness of the insulating member was 100μ and the reference value was the value before the repeated bending was performed. It can be understood that the conversion efficiency of the solar cell deteriorates considerably if the thickness of the insulating member is less than 20μ and more than 200μ.

The connection member comprising the insulating member having the light transmissivity and the conductive member having the comb shape can be manufactured by bonding the insulating member and the conductive member to each other by using an epoxy or acrylic thermosetting adhesive agent.

The conductive material 106 for electrically connecting the conductive member 132 of the connection member having the insulating member having light transmissivity and the conductive member having the comb shape to the current-collecting electrode 105 of the solar cell element is not particularly limited. For example, a conductive adhesive agent such as silver paste or solder may be employed.

The conductive substrate, the lower electrode, the semiconductor layer, the upper electrode, and the comb-shaped electrode of the solar cell element according to this embodiment of the present invention can be formed in a manner similar to the first embodiment.

Embodiment 3

FIGS. 6, 7, 8, and 9 are schematic views which illustrate a third embodiment of the solar cell module according to the present invention.

The solar cell module according to this embodiment is constituted by series connecting a plurality of solar cell elements, in each of which lower electrode layer 102, semiconductor layer 103, upper electrode layer 104, and comb-shaped electrode 105 serving as the current-collecting electrode of the upper electrode layer 104 are formed on conductive substrate 101. Further, a plurality of the solar cell elements are connected in series by using connection member 110 comprising insulating member 111 and conductive member 112. In addition, reverse bias voltage prevention bypass diode 140 is disposed between the connection member 110 and the conductive substrate 101, the connection member 110 comprising the insulating member 111 and the conductive member 112.

Figure 6:
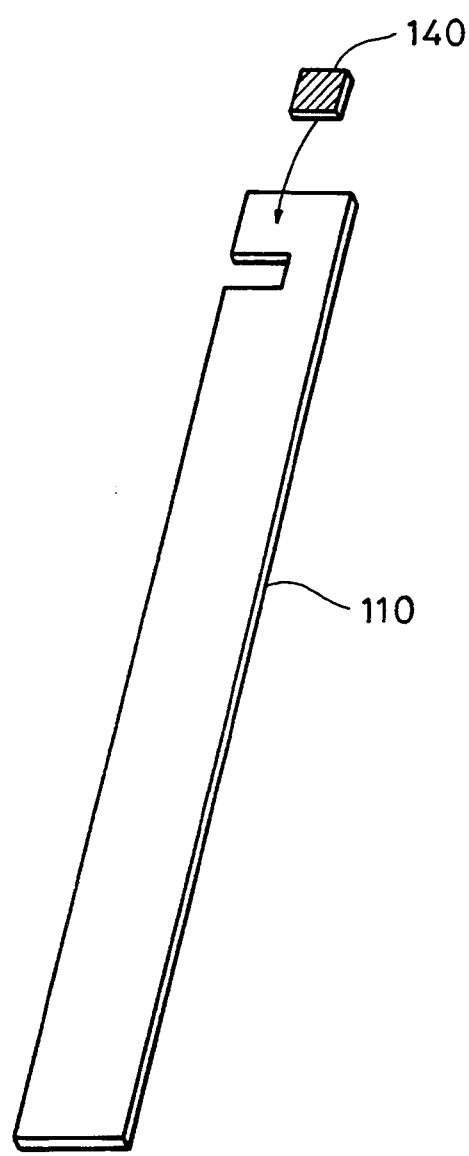
FIG. 6 is a schematic view which illustrates a connection member according to a third embodiment of the present invention.

FIG. 6 is a plan view which illustrates the connection member 110 comprising the insulating member and the conductive member. Reference numeral 140 represents the reverse bias voltage prevention bypass diode which is placed on the connection member comprising the insulating member and the conductive member while interposing a conductive junction member.

Figure 7:
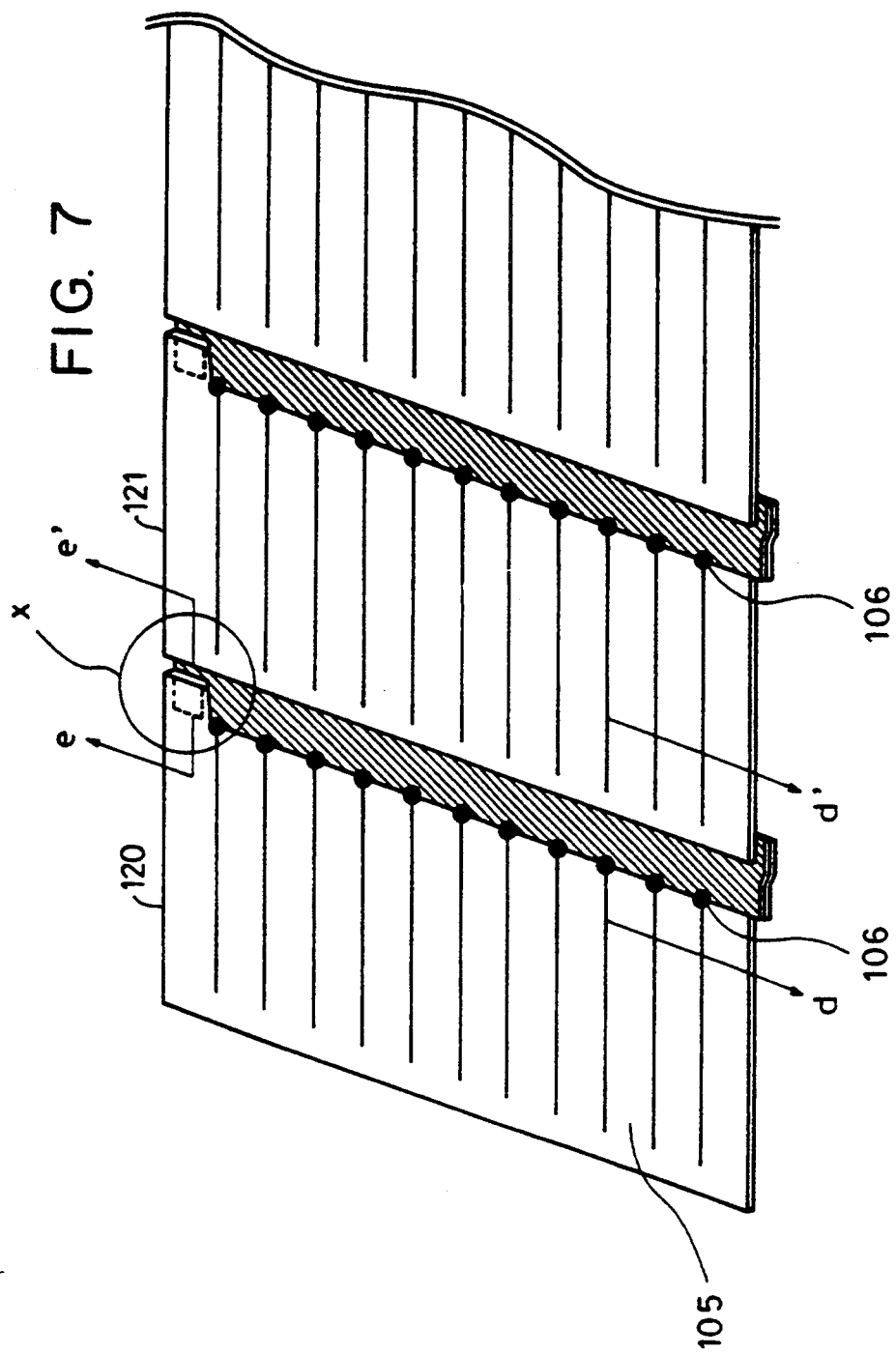
FIG. 7 is a schematic view which illustrates the third embodiment of the solar cell module according to the present invention.

FIG. 7 is a plan view which illustrates the solar cell module constituted by series connecting the solar cell elements using connection members 110 each comprising the insulating member 111 and the conductive member 112. Furthermore, the reverse bias voltage prevention bypass diode 140 is disposed between the connection member 110 and the conductive substrate 101, the connection member 110 comprising the insulating member 111 and the conductive member 112.

Figure 8:
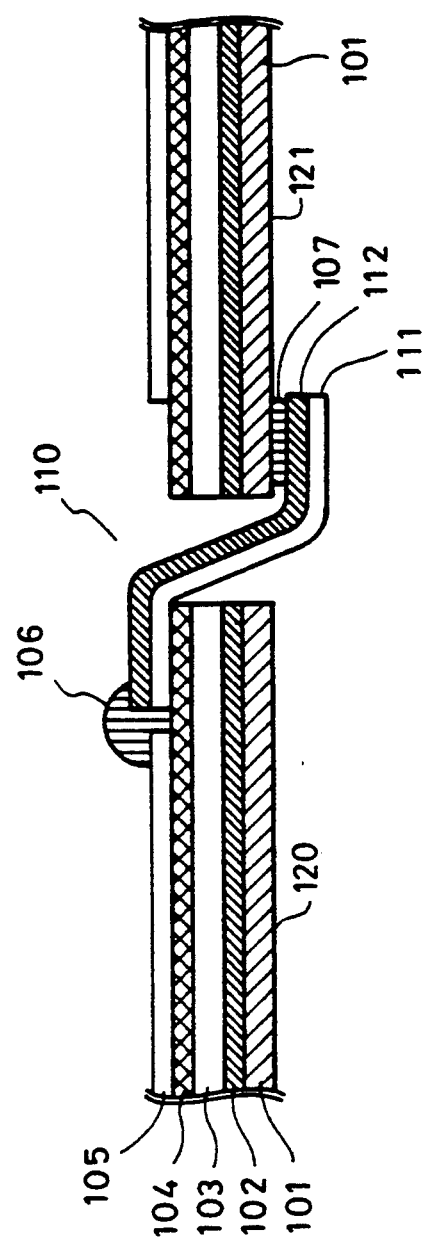
FIG. 8 is a schematic cross-sectional view which illustrates the third embodiment of the solar cell module according to the present invention.
Figure 9:
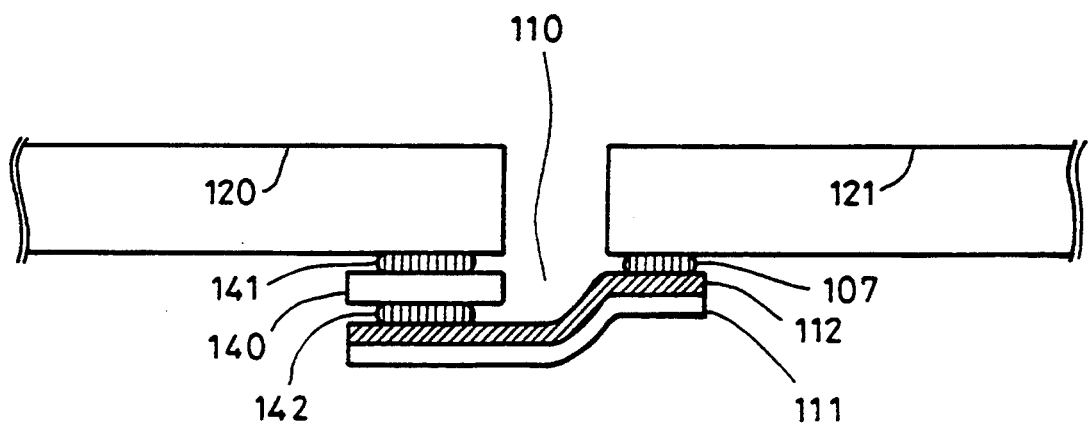
FIG. 9 is a schematic cross-sectional view which illustrates the third embodiment of the solar cell module according to the present invention.
Figure 10:
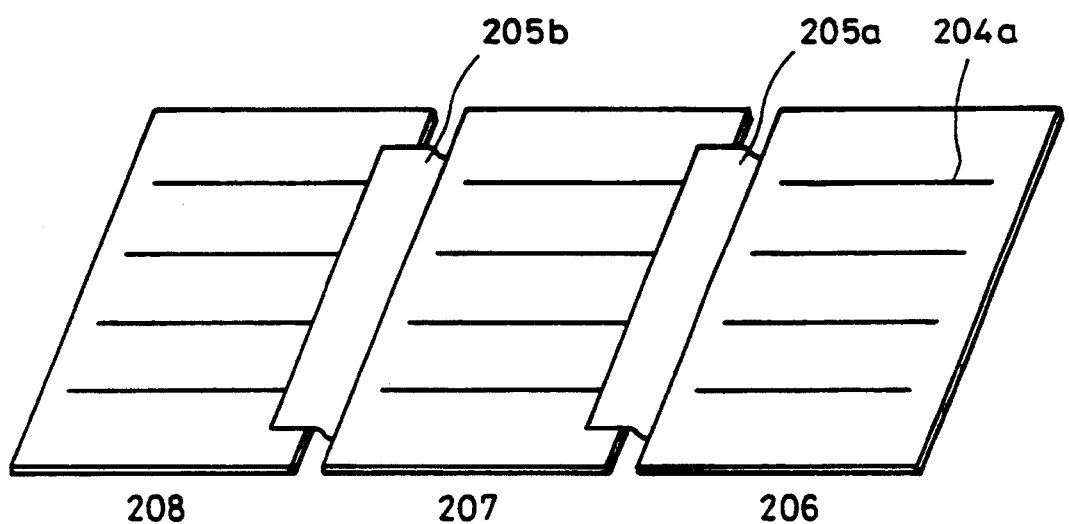
FIG. 10 is a schematic view which illustrates a conventional solar cell module as a comparison with the present invention.
Figure 11:
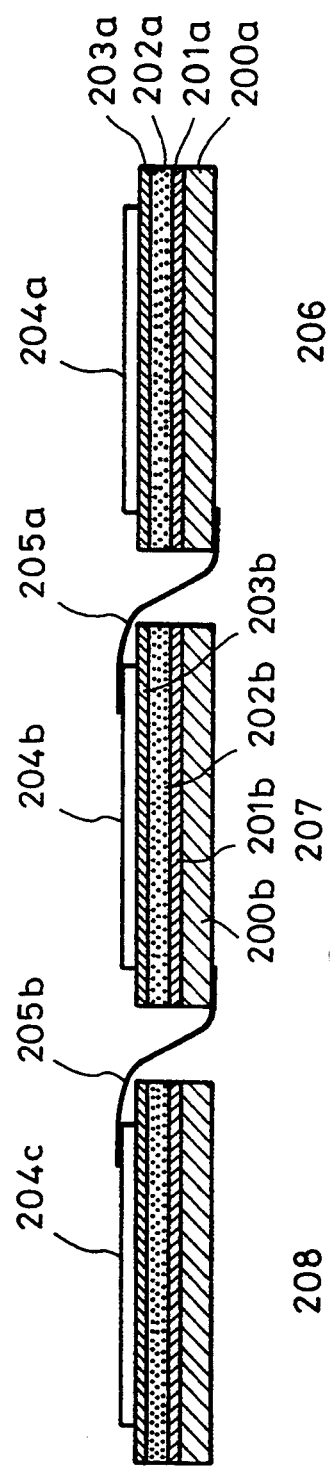
FIG. 11 is a schematic cross-sectional view which illustrates the conventional solar cell module shown in FIG. 10.
Figure 12:
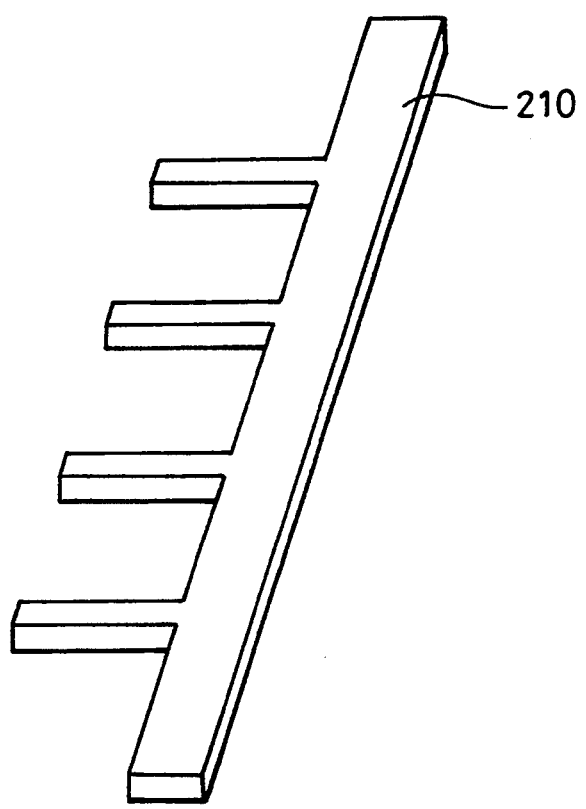
FIG. 12 is a schematic view which illustrates a conventional connection member as a comparison with that according to the present invention.
Figure 13:
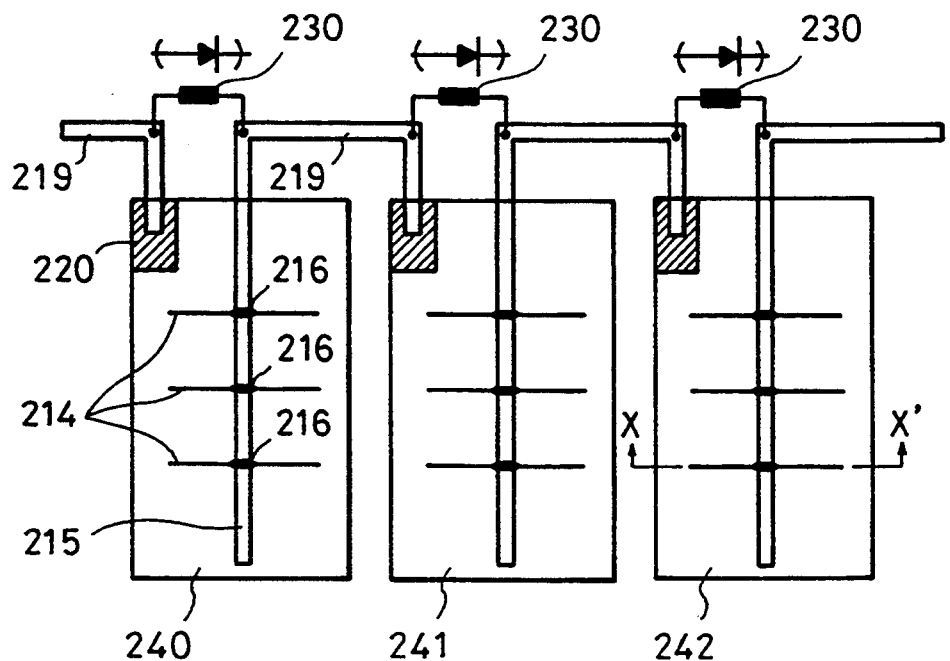
FIG. 13 is a schematic view which illustrates a conventional solar cell module.
Figure 14:
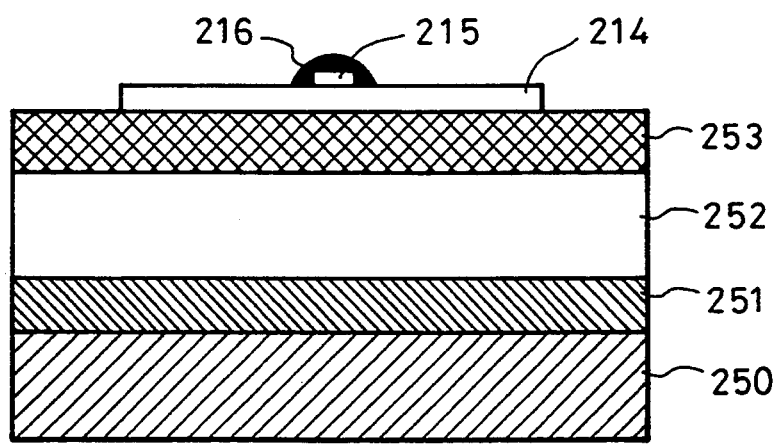
FIG. 14 is a schematic cross-sectional view which illustrates the conventional solar cell module.

FIGS. 8 and 9 are cross-sectional views taken along lines e—e' and d—d' of FIG. 7.

The solar cell elements 120 and 121 are connected to each other by the connection member 110 which comprises the insulating member 111 and the conductive member 112. The current-collecting electrode 105 of the upper electrode 104 of the solar cell element 120 and the connection member 110, which comprises the insulating member 111 and the conductive member 112, are electrically connected to each other by a conductive adhesive agent 106 or the like. The conductive substrate 101 of the solar cell element 121 and the conductive member 112 of the connection member, which comprises the insulating member 111 and the conductive member 112, are electrically connected to each other by a conductive adhesive agent 107 or the like.

The reverse bias voltage prevention bypass diode 140 is, as shown in FIGS. 7 and 9, disposed between the connection member 110 and the conductive substrate 101, the connection member 110 comprising the insulating member 111 and the conductive member 112. Referring to FIG. 9, conductive adhesive agents 141 and 142 are used to electrically connect the reverse bias voltage prevention bypass diode 140 to the solar cell element 120 and to connect the reverse bias voltage prevention bypass diode 140 to the connection member 110.

A portion of the connection member 110 which is connected to the comb-shaped electrode 105 of the solar cell element is formed on the solar cell element 120, the connection member 110 comprising the insulating member 111 and the conductive member 112. On the other hand, a portion of the connection member which is connected to the reverse bias voltage prevention bypass diode is formed below the solar cell element 120.

The conductive material for connecting the solar cell element and the connection member, which comprises the insulating member and the conductive member, and connecting the solar cell element to the connection member is formed of a material similar to that of the first and the second embodiments.

There is no particular limit to the performance and the shape of the reverse bias voltage prevention bypass diode according to the present invention as they are dependent upon the size of the solar cell element, the photovoltaic force, the electric current, and the means for establishing the connection. However, it is preferred that is has a minimum thickness and a small size in order to eliminate the rough portion from the surface of the solar cell module. It is preferable that a chip-type diode be employed. The chip-type diode may be a bare chip which is not covered with a protection member or a molded member made of a resin.

The conductive adhesive agent according to the present invention for electrically connecting the connection member, which comprises the insulating member and the conductive member, and the reverse bias voltage prevention bypass diode to each other may be solder or conductive paste. However, the present invention is not limited to the aforesaid materials.

The conductive adhesive agent according to the present invention for electrically connecting the conductive substrate and the reverse bias voltage prevention bypass diode to each other may be solder or conductive paste. However, the present invention is not limited to the aforesaid materials.

Examples of the present invention will now be described. However, the present invention is not limited to these examples.

Example 1

An amorphous silicon solar cell having a conductive substrate made of stainless steel was manufactured.

Figure 15:
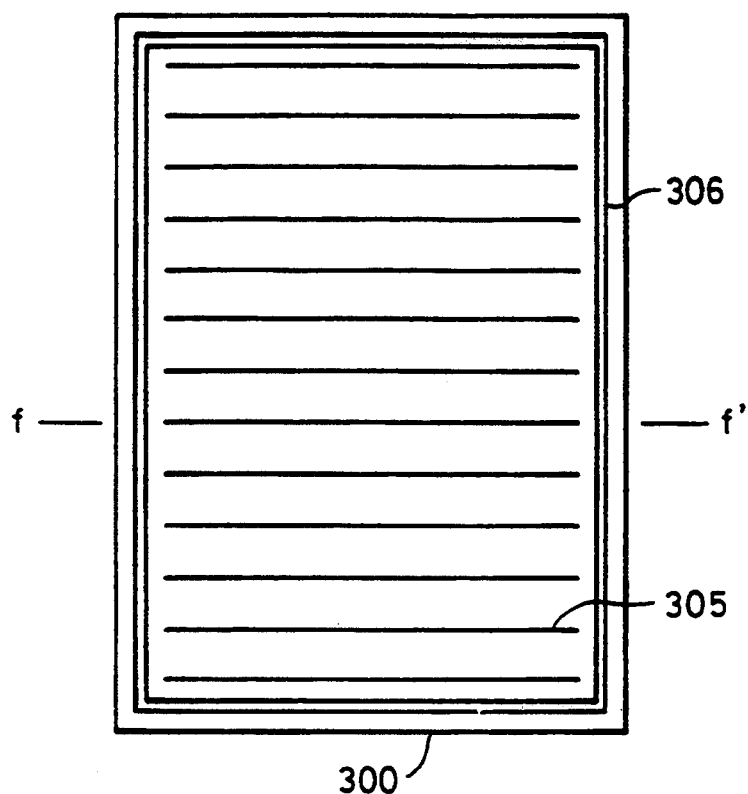
FIG. 15 is a plan view which illustrates the embodiment of a solar cell element according to the present invention.
Figure 16:
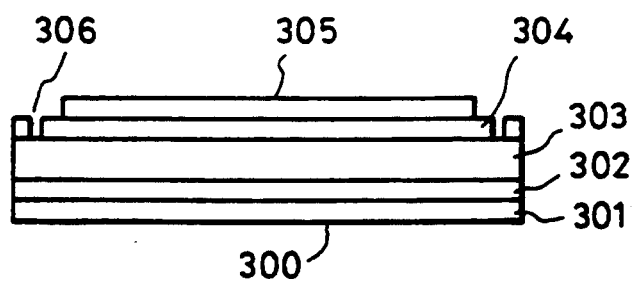
FIG. 16 is a schematic cross-sectional view which illustrates the embodiment of the solar cell module according to the present invention.

FIG. 15 is a plan view which illustrates the solar cell element according to this example. FIG. 16 is a cross-sectional view taken along line f—f' of FIG. 15.

Reference numeral 301 represents a conductive substrate, 302 represents a lower electrode, 303 represents an amorphous silicon semiconductor layer, 304 represents an upper electrode layer, 305 represents a current-collecting comb-shaped electrode, and 306 represents a portion from which the upper electrode has been removed.

First, stainless steel foil having a thickness of 0.1 mm and having a clean surface was prepared to serve as the conductive substrate of the solar cell element.

Then, an aluminum film having a thickness of 5000Å and a ZnO film having a thickness of 700Å were formed on the stainless steel foil by a sputtering method while heating the substrate to 350° C. so as to serve as the lower electrode 302.

Then, an n-type a-Si layer having a thickness of 150Å, an i-type a-Si layer having a thickness of 4000Å, and a p-type a-Si layer having a thickness of 100Å were continuously formed by respectively using $SiH_4$ gas/$PH_3$ gas/$H_2$ gas, $SiH_4$ gas/$H_2$ gas, and $SiH_4$ gas/$BF_3$ gas/$H_2$ gas by a plasma CVD method while maintaining the temperature of the substrate at 250° C., so that a photoelectric conversion layer having a pin junction semiconductor layer 303 was formed.

Then, a transparent layer made of $In_2O_3$—$SnO_2$ film (ITO film) having a thickness of 700Å and serving as the upper electrode 304 was formed on the semiconductor layer serving as the photoelectric conversion layer by resistance heating evaporation of In and Sn at 200° C. in an atmosphere of oxygen.

Then, a rolled stainless substrate with films thus formed thereon was cut to have a pattern shown in FIG. 15, so that three solar cell elements 300 were obtained.

Then, a paste-containing material ($FeCl_3$, HCl) for etching the ITO was screen-printed on the pattern 306 before heating and cleaning processes were performed, so that a portion of the ITO layer on which the paste was printed was removed. As a result, the upper electrode and the lower electrode were electrically separated from each other.

Then, a 0.3 mm-wide current-collecting comb-shaped electrode 305 was screen-printed on the ITO using silver paste, so that a shape shown in FIG. 15 was formed.

Figure 17A:
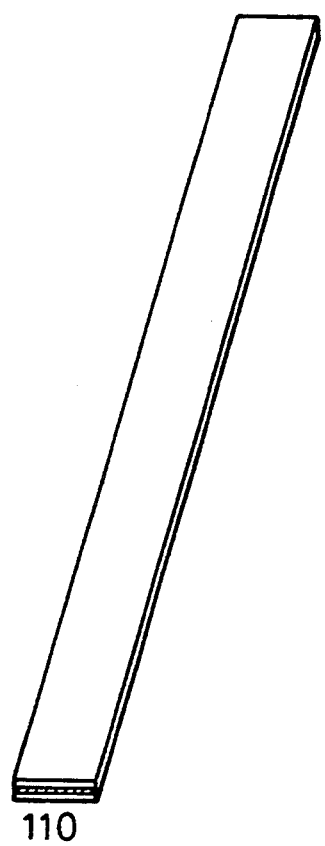
FIGS. 17a and 17b are schematic views which illustrate a connection member for electrically connecting the solar cell elements according to a fourth embodiment of the present invention.
Figure 17B:
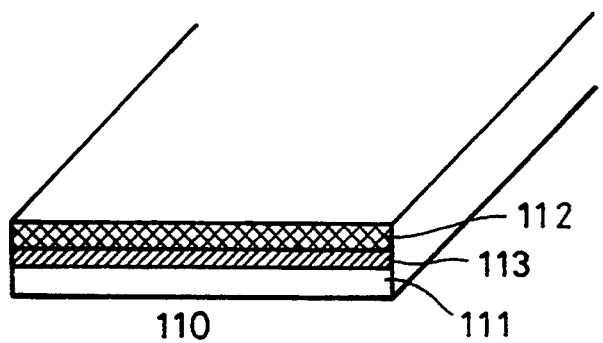

FIG. 17A is a perspective view of a connection member according to this example and comprising an insulating member and a conductive member. FIG. 17B is a perspective view which illustrates the connection member comprising the insulating member and the conductive member.

Referring to FIG. 17B, reference numeral 111 represents a polyimide film having a thickness of $25\mu$, 112 represents copper foil having a thickness of $35\mu$, and 113 represents an acrylic adhesive agent. The connection member was manufactured by heating and pressing together the polyimide film and the copper film, the polyimide film being previously coated with the acrylic adhesive agent. The connection member thus manufactured and comprising the insulating member and the conductive member has flexibility, causing the solar cell module also to have flexibility.

Then, the three solar cell elements were arranged and the connection members shown in FIG. 17A were inserted among the adjacent solar cell elements 300 as shown in FIG. 18. The connection members 110 and the current-collecting electrodes of the solar cell elements were joined and the connection members and the current-collecting substrates of the solar cell elements were joined by applying silver paste from a dispenser.

Then, a positive output terminal 501 was connected by soldering onto the connection member connected to the current-collecting electrode of the right side end solar cell element, the connection member comprising the insulating member and the conductive member. The negative output from the conductive substrate at the top end portion of the left side end solar cell element was formed by connecting a lead wire 502 to the conductive substrate by spot welding.

The solar cell module was then placed on a PET film having a thickness of 0.3 mm before it was encapsulated by a fluorine-containing resin and EVA (ethylene-vinyl acetate copolymer) whereby a solar cell module was manufactured.

The solar cell module has a connection member, which connects adjacent solar cell elements to each other in series and comprises the insulating member and the conductive member, so that the problem of short-circuiting occurring between the solar cell element and the series connection member can be eliminated. Further, the adjacent solar cell elements were free of short-circuits. Therefore, the distance of 1 mm required by a conventional structure in order to position the adjacent solar cells apart from each other could be shortened to 0.2 mm.

Further, the electric current can be dispersed because the series connection member comprises, as shown in FIG. 18, the elongated insulating member and the conductive member, whereby electrical connection between the current-collecting electrode of the solar cell element and the connection member comprising the insulating member and the conductive member and between the connection member comprising the insulating member and the conductive member and the conductive substrate of the adjacent solar cell element were established by a multiplicity of points rather than a single point. As a result, the electrical loss occurring due to a resistive (ohmic) loss caused in an arrangement in which the electric currents are collected at a single point can be eliminated. Therefore, the conversion efficiency was raised by 1%.

Moreover, the manufacturing process be simplified and automation was facilitated because the series connection member comprised the insulating member and the conductive member.

Example 2

A solar cell module was manufactured by a method similar to Example 1 except that a stainless steel foil having a thickness of 0.1 mm and a clean surface was prepared as the conductive substrate, wherein only the back side of the stainless steel substrate was nickel-plated, and the connection member comprising the insulating member and the conductive member and the nickel-plated stainless steel substrate of the adjacent solar cell element were joined by soldering with solder composed of 62% tin and 38% lead and containing resin.

Nickel plating of the stainless steel substrate was performed as follows: first, the surface of the stainless steel substrate was covered with a propylene masking sheet so that only the back surface of the stainless steel substrate was subject to the nickel plating. Then, cathodic electrolytic degreasing was performed at $10A/dm^2$ for 5 minutes and anodic electrolytic degreasing was performed at $10A/dm^2$ for 2 minutes before cleaning was performed with hydrochloric acid as a pre-treatment for the plating process. Then, the underlayer for plating was formed by immersion in a nickel strike bath at $3A/dm^2$ for 30 seconds before nickel electroplating was performed in a nickel plating bath at $3A/dm^2$ for 4 minutes, so that nickel plating having a thickness of $2\mu$ was applied.

In addition to the effect obtainable from Example 1, in the solar cell module according to this example the connection member and the stainless steel substrate were connected to each other with a connection five times stronger than that realized when silver paste was used as the connection member. This was because the portion of the stainless substrate, which was connected to the connection member, was applied with nickel plating so as to be soldered. As a result, the quality of the solar cell module was improved.

Example 3

An amorphous silicon solar cell comprising a stainless steel substrate serving as the conductive substrate according to this example was manufactured.

Figure 19A:
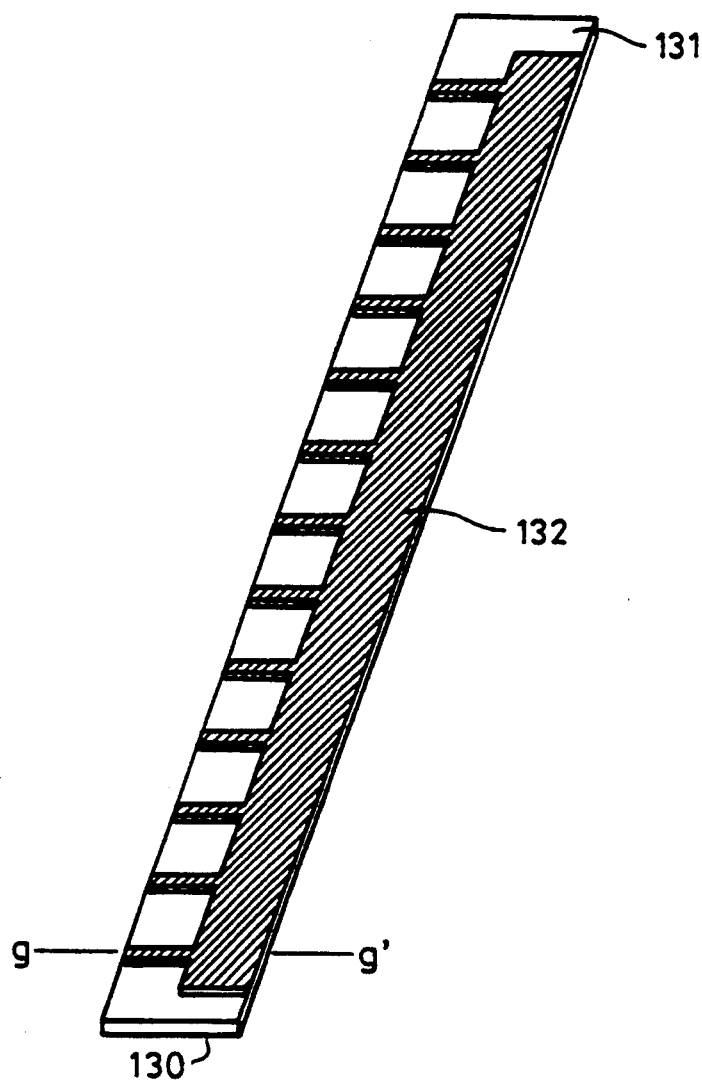
FIGS. 19a and 19b are schematic views which illustrate another example of the connection member according to a fifth embodiment of the present invention.
Figure 19B:
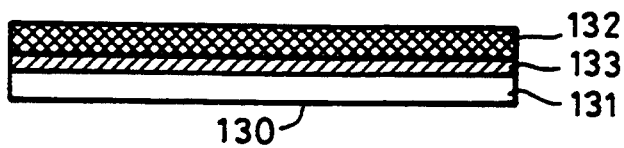

FIG. 19A is a perspective view which illustrates a connection member according to this example and comprising an insulating member having light transmissivity and a conductive member having a comb shape. FIG. 19B is a cross-sectional view which illustrates the connection member comprising the insulating member having light transmissivity and the conductive member having the comb shape.

Reference numeral 131 represents a polyimide film having a thickness of $25\mu$ and a visible light transmissivity of 50%, 132 represents a comb-shaped copper foil having a thickness of $35\mu$, and 133 represents an acrylic-type thermosetting adhesive agent. The connection member according to this example was manufactured by heating and pressing together the polyimide film, to which the acrylic type adhesive agent was applied, and the copper foil. The comb shape of the copper foil was formed by utilizing photolithographic technology.

Since the connection member-thus manufactured and comprising the insulating member having light transmissivity and the conductive member having the comb shape has flexibility, the solar cell module also has flexibility.

Figure 20:
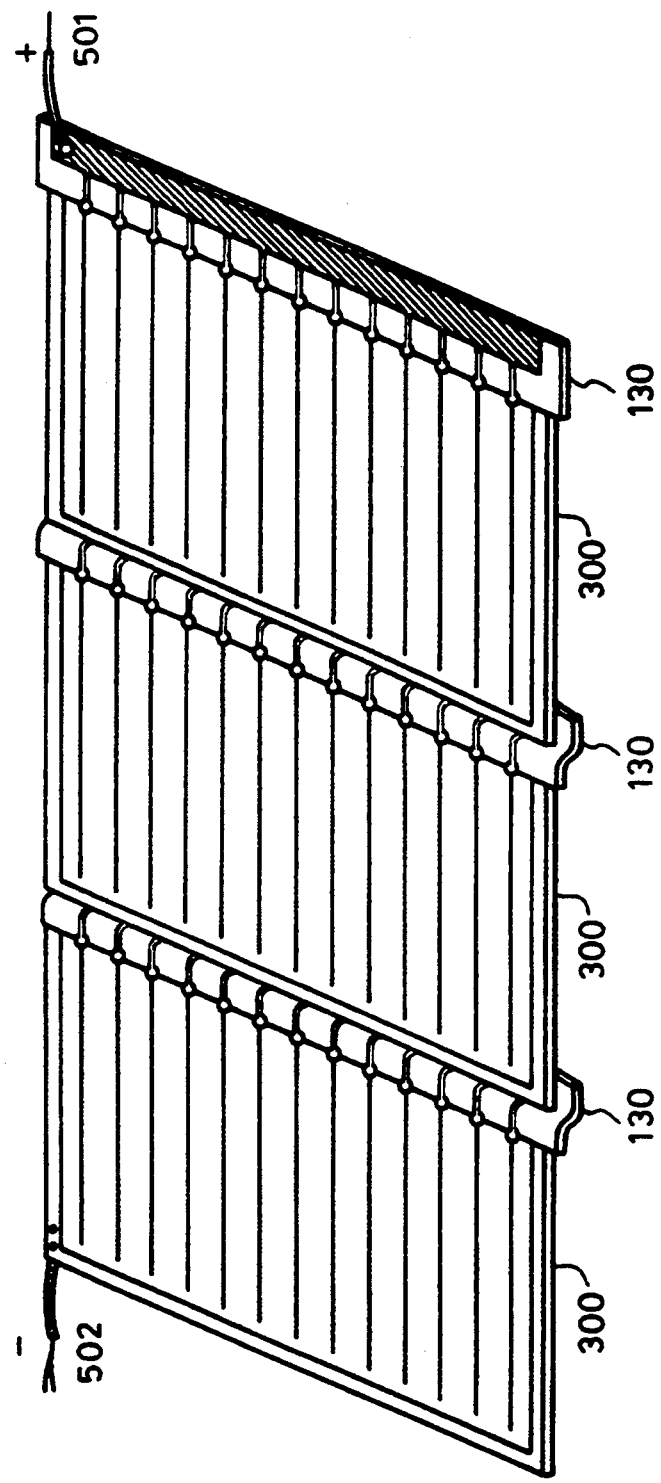
FIG. 20 is a schematic view which illustrates the fifth embodiment of the solar cell module according to the present invention.

Then, connection members 130 shown in FIG. 19A and comprising the insulating member having light transmissivity and the conductive member having the comb shape were, as shown in FIG. 20, inserted between the three solar cell elements 300 arranged as shown in FIG. 3. The connection member and the current-collecting element were joined and the connection member and the conductive substrate of the adjacent solar cell element were joined using a silver paste adhesive.

A positive output terminal 501 was then, by soldering, connected onto the connection member connected to the current-collecting electrode of the right side end solar cell element shown in FIG. 20. The negative output from the conductive substrate at the top end portion of the left side end solar cell element was formed by connecting a lead wire 502 to the conductive substrate by spot welding.

Then, the solar cell module was placed on the PET film having a thickness of 0.3 mm before they were encapsulated with a fluorine-containing resin and EVA (ethylene-vinyl acetate copolymer), whereby a solar cell module was manufactured.

The solar cell module has a connection member, which electrically connects the adjacent solar cell elements to each other and which comprises the insulating member having light transmissivity and the conductive member having the comb shape, so that the light-receiving portion of the solar cell element positioned below the connection member comprising the insulating member having light transmissivity and the conductive member having the comb shape can be a current-generating region. Therefore, the conversion efficiency was improved by about 5% as compared with a structure in which copper foil was used to form the series connection member of the solar cell element.

Further, the problem of short-circuits occurring between the solar cell element and the series connection member can be eliminated. In addition, the structure in which the conductive member is held by the insulating members can eliminate short-circuits occurring between the adjacent solar cell elements. Therefore, the distance between the adjacent solar cell elements can be minimized, and reliability is also improved.

Example 4

A solar cell module was manufactured by a method similar to that of Example 3 except that polyester resin having a thickness of $25\mu$ and a visible light transmissivity of 90° was used as the insulating material of the connection member comprising the insulating member and the conductive member.

By using the polyester resin to form the insulating material of the connection member comprising the insulating member and the conductive member, the conversion efficiency was improved by about 10% as compared with a structure comprising a series connection member made of copper foil.

Furthermore, the flexibility of the connection member comprising the insulating member and the conductive member was improved and the cost of the member formed by combining the insulating member and the conductive member was decreased even further.

Example 5

Figure 21:
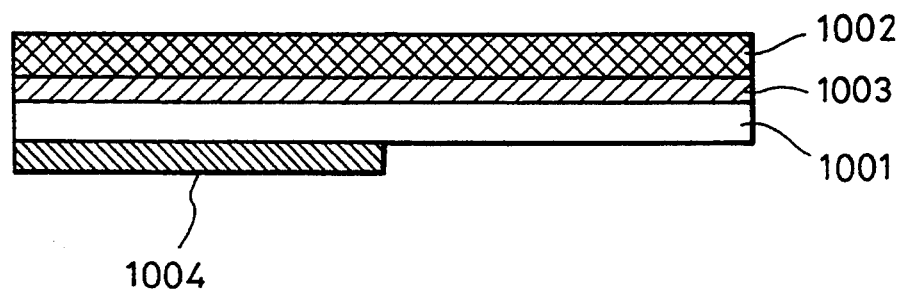
FIG. 21 is a schematic view which illustrates the connection member according to a sixth embodiment of the present invention.

Transparent adhesive tape 1004 arranged as shown in FIG. 21 was applied to the insulating member according to Example 4, comprising an insulating member having light transmissivity and a conductive member having a comb shape. Referring to FIG. 21, reference numeral 1001 represents the polyester resin according to Example 4, 1002 represents the copper foil according to Example 4, 1003 represents an acrylic adhesive agent, and 1004 represents a transparent acrylic adhesive tape having a thickness of $30\mu$. The adhesive tape is applied to the portion of the insulating member having light transmissivity and positioned on the surface of the solar cell element, the insulating member having light transmissivity being a component of the connection member comprising the insulating member having light transmissivity and the conductive member having the comb shape. As a result, the connection member comprising the insulating member having light transmissivity and the conductive member having the comb shape and the solar cell element were fixed to each other.

The other arrangements were similar to those according to Example 3, whereby a solar cell module was manufactured.

Hence, the process for connecting the connection member comprising the insulating member having light transmissivity and the conductive member having the comb shape and the current Collecting electrode to each other by using the silver paste adhesive agent can be simplified and the reliability of the connection portions improved.

Example 6

In this example, an amorphous silicon solar cell having a conductive substrate made of stainless steel was manufactured. The solar cell element was manufactured by a method similar to that of Example 1.

Figure 22A:
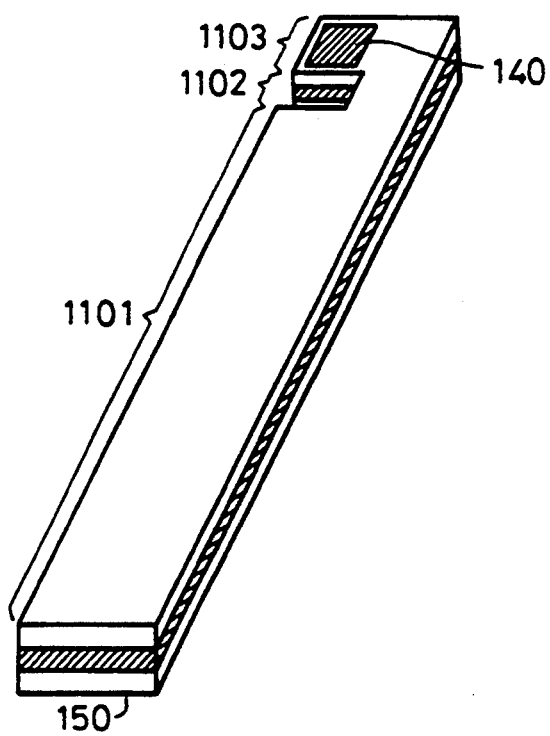
FIGS. 22a–22c are schematic views which illustrate the seventh embodiment of the connection member according to the present invention.
Figure 22B:
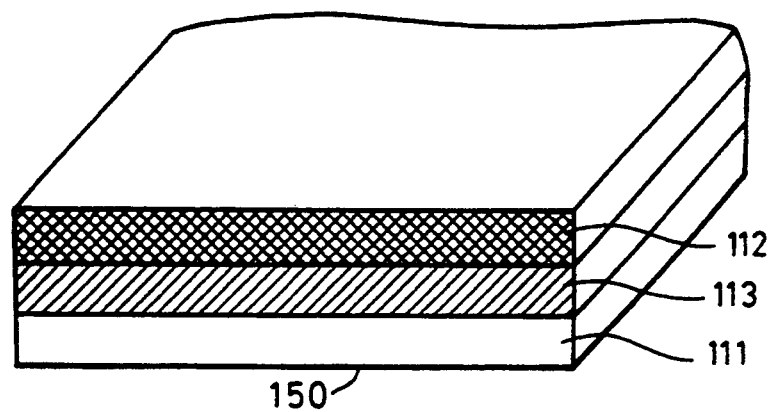
Figure 22C:
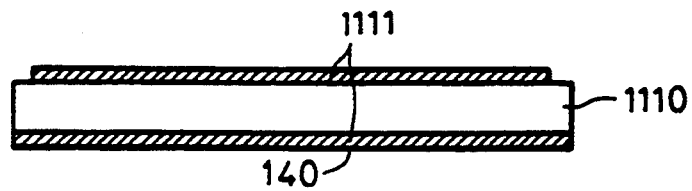

FIG. 22A illustrates a connection member wherein a silicon diode of 2.5 mm by 2.5 mm and a thickness of 0.2 mm was mounted thereon by soldering to the end portion of the upper surface of the connection member, comprising an insulating member and a conductive member. FIG. 22B is a perspective view which illustrates the connection member 150 comprising the insulating member 111 and the conductive member 112. FIG. 22C is a cross-sectional view which illustrates a silicon diode 140. Reference numerals 1110 and 1111 represent gold electrodes.

As shown in FIG. 22A, the connection member comprising the insulating member and the conductive member can be sectioned into a portion 1101 to be connected to the comb-shaped electrode of the solar cell element, a portion 1103 to which a silicon diode is connected by soldering so as to be connected to the conductive substrate of the solar cell element and a cut-out portion 1102 for connecting the portion 1103 to the lower side of the conductive substrate.

Referring to FIG. 22B, reference numeral 111 represents a polyimide film having a thickness of 25μ, 112 represents copper foil having a thickness of 35μ, and 113 represents an acrylic adhesive agent. The connection member was manufactured by heating and pressing together the polyimide film and the copper film, the polyimide film first being applied with the acrylic adhesive agent.

The connection member thus manufactured and comprising the insulating member and the conductive member has flexibility, causing the solar cell module also to have flexibility.

The connection members were then arranged as shown in FIG. 22B and in FIG. 23, inserted between adjacent solar cell elements 300 arranged as shown in FIG. 15. The connection members and the current-collecting electrodes of the solar cell elements were joined and the connection members and the current-collecting substrates of the solar cell elements were joined by using silver paste adhesive agent.

The portion 1103 in which the silicon diode was connected by soldering to the upper end portion of the connection member was positioned below the stainless steel substrate of the solar cell element 300. Further, the silicon diode 140 and the stainless steel substrate were electrically connected to each other by using the silver paste adhesive agent.

Then, a positive output terminal 501 was connected by soldering onto the connection member connected to the current collecting electrode of the right side end solar cell element, the connection member comprising the insulating member and the conductive member. The negative output from the conductive substrate at the top end portion of the left side end solar cell element was formed by connecting a lead wire 502 to the conductive substrate by spot welding.

Then, the solar cell module was placed on a PET film having a thickness of 0.3 mm before it was encapsulated by a fluorine-containing resin and EVA (ethylene-vinyl acetate copolymer), whereby a solar cell module was manufactured.

The reverse bias voltage prevention bypass diode was disposed between the connection member comprising the insulating member and the conductive member and the conductive substrate. Therefore, the necessity of positioning the reverse bias voltage prevention bypass diode away from each solar cell element can be eliminated. Further, short-circuits occurring between the solar cell elements and between the solar cell element and the connection member can be eliminated. As a result, the ratio of the areas of the effective generating region with respect to the overall body of the solar cell module can be increased.

By using a chip-type reverse bias voltage prevention bypass diode 140, the thickness of the portion of the solar cell element on which the reverse bias voltage prevention bypass diode was mounted can be decreased to 1 mm or less. Therefore, the projection of the solar cell module due to the presence of the reverse bias voltage prevention bypass diode can be prevented. Furthermore, the problem that bubbles are left in the filler placed adjacent to the reverse bias voltage prevention bypass diode can be prevented, resulting in the reliability of the solar cell module being maintained for a long time. Moreover, the material cost and a manufacturing process for establishing the connection can be reduced because wiring for connecting the reverse bias voltage prevention bypass diode and each solar cell element to each other can be omitted from the structure.

By constituting the connection member for electrically connecting the adjacent solar cell elements to each other by the insulating member and the conductive member, short-circuits occurring between the solar cell elements and the series connection members can be prevented. Further, short-circuits occurring between the adjacent solar cell elements can be prevented. Hence, the distance between the adjacent solar cell elements can be minimized.

Further, electric current can be dispersed because the series connection member comprises, as shown in FIG. 23, the elongated insulating member and the conductive member, wherein the electrical connection between the current-collecting electrode of the solar cell element and the connection member comprising the insulating member and the conductive member and that between the connection member comprising the insulating member and the conductive member and the conductive substrate of the adjacent solar cell element are established by a multiplicity of points in place of a single point. As a result, the electrical loss occurring due to resistive (ohmic) loss caused by the arrangement in which the electric currents are collected to a single point can be eliminated.

Moreover, the manufacturing process can be simplified and automation facilitated because the aforesaid connection member was used.

Example 7

Figure 24:
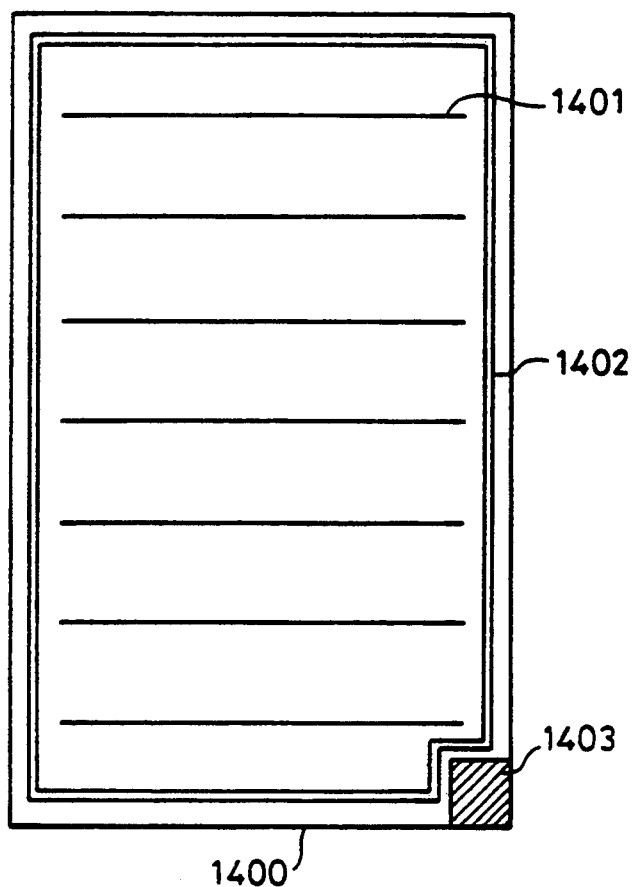
FIG. 24 is a plan view which illustrates the eighth embodiment of the solar cell element according to the present invention.
Figure 25:
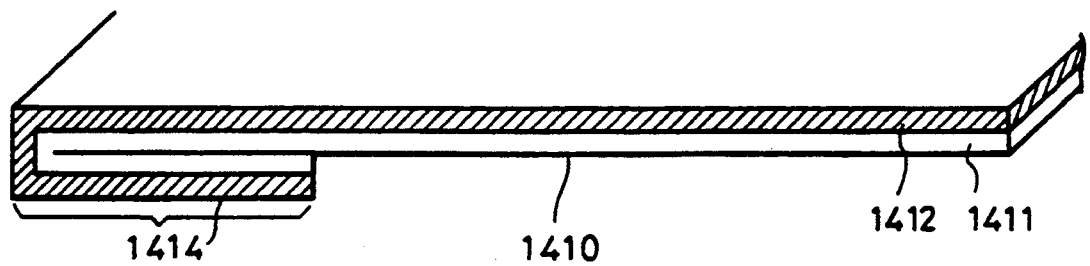
FIG. 25 is a schematic view which illustrates another example of the connection member according to the present invention.
Figure 26:
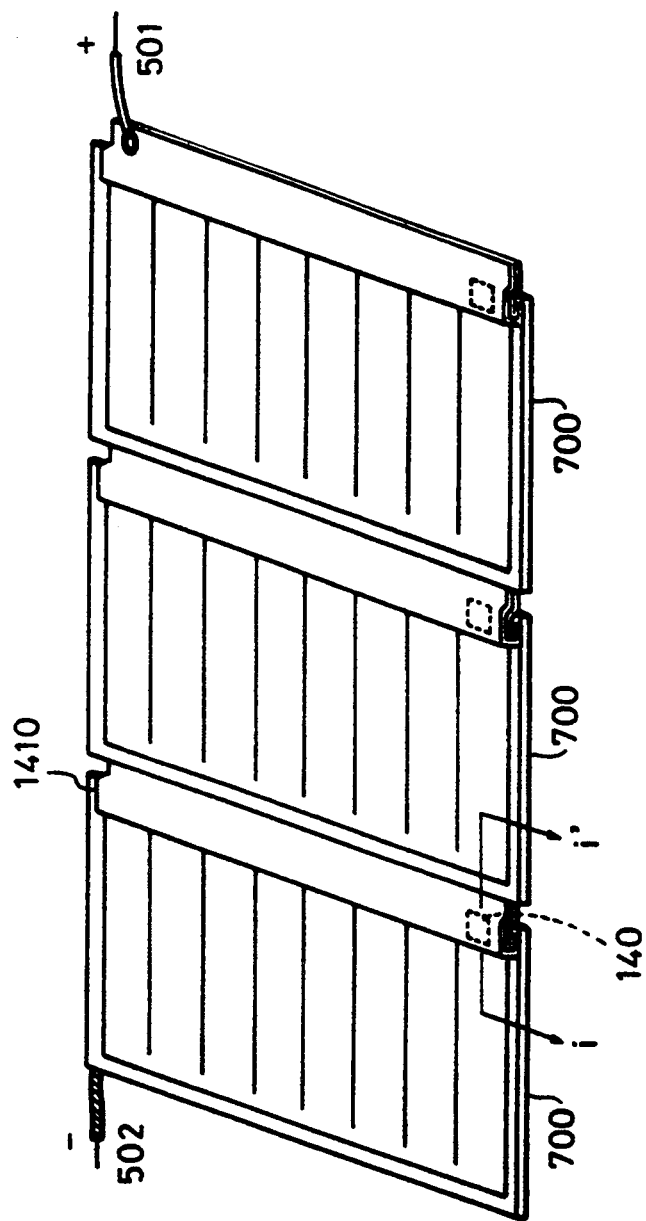
FIG. 26 is a schematic view which illustrates the eighth embodiment of the solar cell module according to the present invention.
Figure 27:
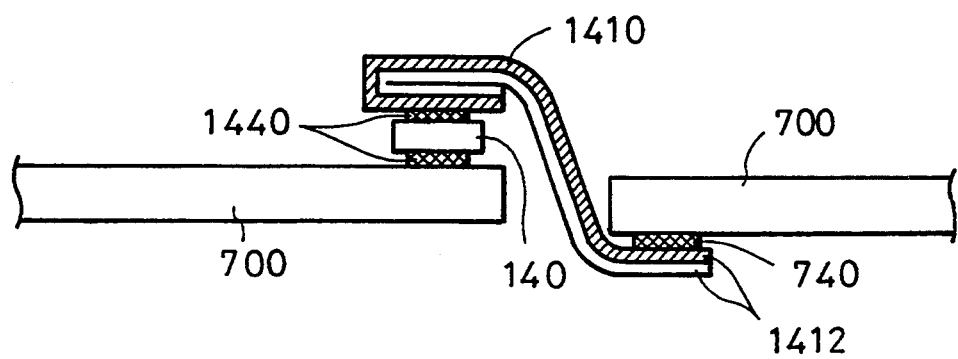
FIG. 27 is a schematic cross sectional view which illustrates the solar cell module according to the eighth embodiment of the present invention.

Although Example 6 has an arrangement wherein the chip-type diode is connected to the back side of the stainless steel substrate, this example has an arrangement wherein a similar chip-type diode is connected to the upper side of the stainless steel substrate. FIG. 24 is a plan view which illustrates a solar cell element according to this example. FIG. 25 is a cross-sectional perspective view which illustrates a connection member according to this example and comprising the insulating member and the conductive member. FIG. 26 illustrates the solar cell elements connected in series by the connection member and a chip-type diode connected between the surface of the solar cell element and the conductive member of the connection member. FIG. 27 is a cross-sectional view taken along line i—i' of FIG. 26.

Referring to FIG. 24, reference numeral 1400 represents a solar cell element manufactured by a method similar to that according to Example 6, 1401 represents silver paste, and 1402 represents a portion from which an ITO layer has been removed. Reference numeral 1403 represents a portion in which the stainless steel substrate is exposed.

Referring to FIG. 25, reference numeral 1411 represents a polyimide film having a thickness of $25\mu$, and 1412 represents copper foil having a thickness of $35\mu$. The polyimide film 1411 and the copper foil 1412 were bonded by an acrylic-type thermosetting adhesive agent.

As shown in FIG. 25, the connection member according to this embodiment is folded back at the end portion 1414 thereof.

Then, three solar cell elements 1400 arranged as shown in FIG. 26 were prepared, and the connection members as shown in FIG. 25 were inserted between adjacent solar cell elements 700. Further, the chip-type diode 140 according to Example 6 was, by using a silver paste adhesive agent 1440 as shown in FIG. 27, connected between the portion 1403 of the solar cell element 700 in which the stainless steel substrate was exposed and the folded end portion 1414 of the connection member 1410 comprising the insulating member and the conductive member. FIG. 27 is a cross-sectional view taken along line i—i' of FIG. 26.

The connection between the folded end portion 1414 of the connection member and the comb-shaped electrode and the electrical connection between the adjacent stainless steel substrates and the connection member 1410 were obtained by applying the silver paste adhesive agent from a dispenser.

The lead wires were then attached before encapsulation was performed to extend outside the encapsulation.

In addition to the effect obtainable from Example 6, the solar cell module according to this example is obtained by a simplified manufacturing process because the reverse bias voltage bypass diode is connected to the upper surface of the solar cell element.

Example 8

An amorphous silicon solar cell having a conductive substrate made of stainless steel was manufactured.

FIG. 15 is a plan view which illustrates the solar cell element according to this example. FIG. 16 is a cross-sectional view taken along line f—f' of FIG. 15.

Reference numeral 301 represents a conductive substrate, 302 represents a lower electrode, 303 represents an amorphous silicon semiconductor layer, 304 represents an upper electrode layer, 305 represents a current-collecting comb-shaped electrode, and 306 represents a portion from which the upper electrode has been removed.

First, stainless steel foil having a thickness of 0.1 mm and a clean surface was prepared to serve as the conductive substrate of the solar cell element.

An aluminum film having a thickness of 5000Å and a ZnO film having a thickness of 700Å were then formed on the stainless steel foil by a sputtering method while heating the substrate to 350° C. so as to serve as the lower electrode.

Then, an n-type a-Si layer having a thickness of 150Å, an i-type a-Si layer having a thickness of 4000Å, and a p-type a-Si layer having a thickness of 100k were continuously formed by respectively using $SiH_4$ gas/$PH_3$ gas/$H_2$ gas, $SiH_4$ gas/$H_2$ gas, and $SiH_4$ gas/$BF_3$ gas/$H_2$ gas by a plasma CVD method while maintaining the temperature of the substrate at 250° C., so that a photoelectric conversion layer composed of three layers and having a pin junction semiconductor layer 303 was formed.

A transparent electrode made of $In_2O_3$—$SnO_2$ film (ITO film) having a thickness of 700Å and serving as the upper electrode was then formed on the semiconductor layer serving as the photoelectric conversion layer by resistance heating evaporation of In and Sn at 200° C. in an atmosphere of oxygen.

A rolled stainless substrate having the films thus formed thereon was then cut to have a pattern as shown in FIG. 15, to that three solar cell elements 300 were obtained.

Then, a paste-containing material ($FeCl_3$, HCl) for etching the ITO was screen-printed on the pattern 306 before heating and cleaning processes were performed, to that a portion of the ITO layer on which the paste was printed was removed. As a result, the upper electrode and the lower electrode were electrically separated from each other.

A 0.3 mm-wide current collecting comb-shaped electrode 305 was then screen-printed on the ITO by using silver paste, so that a shape shown in FIG. 15 was formed.

FIG. 17A is a perspective view of a connection member according to this example and comprising the insulating member and the conductive member. FIG. 17B is a cross-sectional perspective view which illustrates the connection member comprising the insulating member and the conductive member.

Referring to FIG. 17B, reference numeral 111 represents a polyimide film having a thickness of $25\mu$, 112 represents copper foil having a thickness of $35\mu$, and 113 represents an acrylic adhesive agent. The connection member was manufactured by heating and pressing together the polyimide film and the copper film, the polyimide film first being applied with the acrylic adhesive agent. The connection member thus manufactured and comprising the insulating member and the conductive member has flexibility, thereby providing a solar cell module with flexibility.

Figures 29A, 29B:
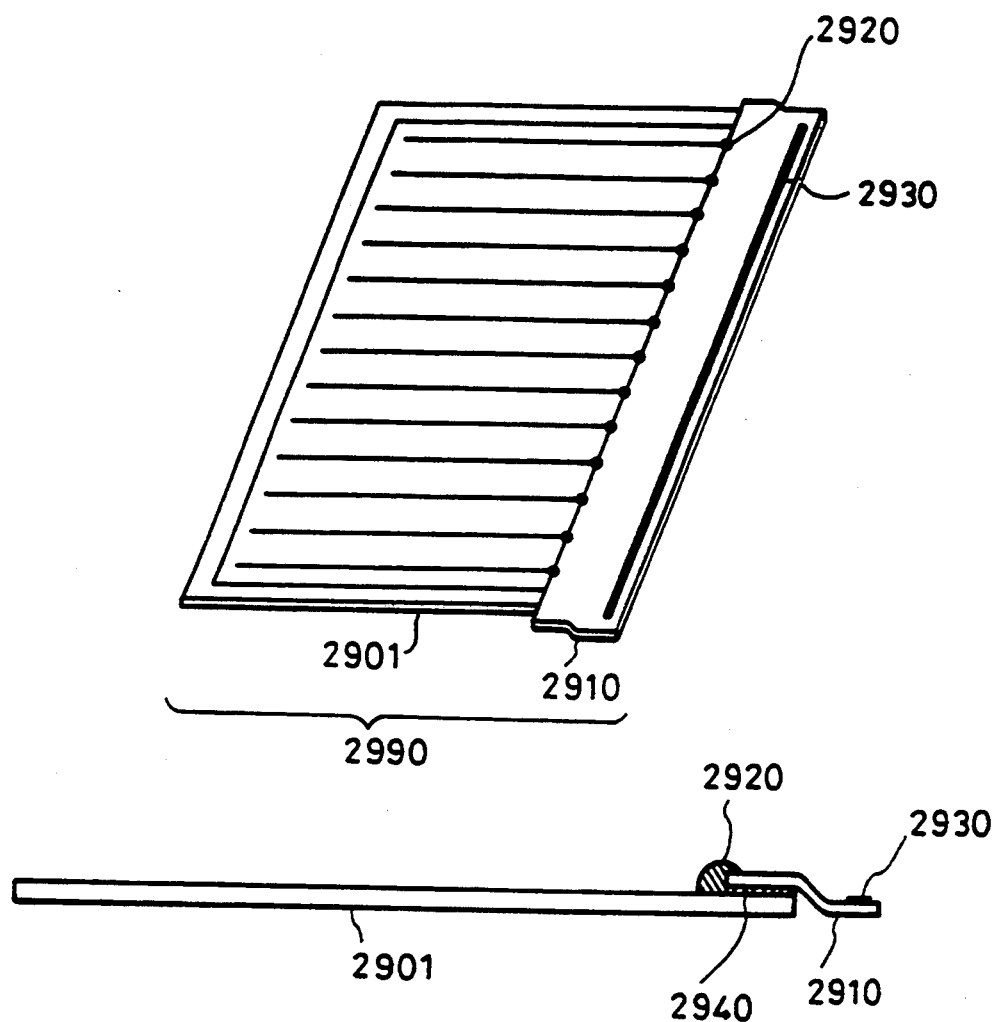
FIGS. 29a and 29b are schematic views which illustrate a sub-assembly of the connection member and the solar cell according to the present invention.

Referring to FIGS. 29 and 30, a method of connecting the aforesaid solar cell elements by the connection members each comprising the insulating member and the conductive member will now be described in detail.

(1) First, a heat-resistant double-sided tape 2940 was applied to one side of the insulating member of connection member 2910.

(2) Then, the connection member 2910 was applied to an end portion of solar cell element 2901.

(3) Then, the electrical connection between the aforesaid connection member and the current-collecting electrode of the solar cell element 2901 was formed by applying silver paste 2920 from a dispenser and by drying and hardening it for one hour in an oven set to 250° C.

(4) Then, silver paste 2930 was applied to the upper surface of the copper foil of the connection member connected to the solar cell element from a dispenser, so that sub-assemblies 2990 of the solar cell elements were manufactured.

(5) The aforesaid sub-assemblies were then sequentially stacked as shown in FIG. 30, and the silver paste was dried and hardened for one hour in an oven set at 150° C., so that three solar cell elements 2900, 2901, and 2902 were connected in series.

Specifically, the solar cell element 2901 was placed on the connection member connected to the solar cell element 2902, and the solar cell element 2900 was placed on the connection member 2910 connected to the solar cell element 2901 so that they were connected in series. Hence, the solar cell module shown in FIG. 18 was manufactured.

Then, a positive output terminal was, by soldering, connected onto the connection member connected to the current-collecting electrode of the right side end solar cell element, the connection member comprising the insulating member and the conductive member. The negative output from the conductive substrate at the top end portion of the left side end solar cell element was formed by connecting a lead wire to the conductive substrate by spot welding.

Then, the solar cell module was placed on a PET film having a thickness of 0.3 mm before they were encapsulated by a fluorine-containing resin and EVA (ethylene-vinyl acetate copolymer), whereby a solar cell module was manufactured.

The solar cell module has a connection member, which electrically connects the adjacent solar cell elements to each other and which comprises the insulating member and the conductive member, so that the problem of short-circuits occurring between the solar cell element and the connecting member can be eliminated. Further, the adjacent solar cell elements were freed from shortcircuits. Therefore, the distance of 1 mm required for conventional structure to position the adjacent solar cells apart from each other could be shortened to 0.2 mm.

Further, electric current can be dispersed because the connection member comprises, as shown in FIG. 18, the elongated insulating member and the conductive member, the electrical connection between the current-collecting electrode of the solar cell element and the connection member comprising the insulating member and the conductive member and that between the connection member comprising the insulating member and the conductive member and the conductive substrate of the adjacent solar cell element being established by a multiplicity of points in place of a single point. As a result, electrical losses due to resistive (ohmic) loss, resulting from the arrangement in which the electric currents are collected to a single point, can be eliminated. Therefore, the conversion efficiency was increased by 1.

Moreover, the manufacturing process can be simplified and automation facilitated because the connection member comprises the insulating member and the conductive member.

Example 9

A solar cell module was manufactured by a method similar to that of manufacturing the solar cell module according to Example 8, except for connecting the solar cell elements and the connection member with polyimide and copper foil.

Referring to FIGS. 31 and 32, the solar cell module according to Example 9 was manufactured as follows:

(1) First, a solar cell element 3100 similar to that according to Example 8 was manufactured. Then, the connection member having one side made of a polyimide portion thereof to which a heat-resistant double-sided tape 3140 (F-9460PC) comprising copper foil was applied and the polyimide portion was connected to the back side of the stainless substrate of the solar cell element 3100 by using silver paste 3130. As a result, sub-assemblies 3190 of the solar cell element and the connection member were manufactured. The silver paste 3130 was hardened when it was dried for one hour in an oven set to 150° C.

(2) Then, the sub-assemblies of the solar cell elements and the connection members were sequentially stacked, to that the solar cell elements were allowed to overlap as shown in FIG. 32.

Specifically, a sub-assembly 3190 of the solar cell element and the connection member was placed on the solar cell element 3102. The upper electrode of the solar cell element 3102 and the sub-assembly 3190 were fixed to each other by using a double-coated tape.

Then, the connection member portion of another sub-assembly 3190 was placed and fixed to the upper surface of the solar cell element 3101 of the sub-assembly 3190, so that three solar cell elements 3100, 3101, and 3102 were connected in series.

An output electrode from the current-collecting electrode 3150 of the next solar cell element was formed by using a joint member 3110 made of polyimide and copper foil. The current-collecting electrode and the joint member were electrically connected to each other by using the silver paste.

According to the present invention, the connection member for the series connection of the adjacent solar cell elements to each other has a stacked structure composed of the insulating member and the conductive member, so that electrical short-circuits occurring between the conductive member of the series connection member and the lower electrode of the solar cell element having the current-collecting electrode to which the conductive member-of the connection member is connected can be prevented. Further, short-circuits occurring between the conductive substrates of the solar cell elements can be prevented. Therefore, the necessity of positioning the solar cell elements away from each other by an excessively long distance can be eliminated. Hence, the non-generating region of the solar cell module can be decreased, resulting in the improvement of the conversion efficiency of the solar cell.

Further, the reliability of the solar cell module can be maintained for a long time because short-circuits between the solar cell elements occurring due to the solar cell module being bent during use of the solar cell module or due to the expansion/contraction of the solar cell module caused from the temperature change or the temperature and humidity cycle and the like is prevented.

Further, the connection member can be strengthened because the series connection member comprises the insulating member and the conductive member. Hence, the quality of the solar cell module can be improved.

Moreover, electric power loss due to current loss can be prevented because the series connection member comprises the elongated insulating member and the conductive member so as to collect electric currents from a plurality of current-collecting electrodes.

In addition, automation can easily be established, and solar cell modules, the cost of each of which can be reduced, can be provided.

If the connection member for connecting adjacent solar cell elements in series has a stacked structure composed of the insulating member having light transmissivity and the conductive member having the comb shape, the non-generating region can be reduced because the light-receiving area of the solar cell module can be increased. Hence, the conversion efficiency of the solar cell module can be improved.

Even if the solar cell module is repeatedly bent, the connection member for establishing the series connection cannot be broken. Therefore, reliability can be maintained for a long time.

Even if a thick connection member for establishing series connection is employed, the solar cell element can be protected from damage caused by the edge of the connection member. Therefore, manufacturing yield can be improved, resulting in a cost-effective solar cell module.

Since the series connection member comprises the insulating member having light transmissivity and the conductive member having the comb shape, the connection member can be strengthened. Hence, quality of the solar cell module can be improved and conversion efficiency can be raised.

The connection member for establishing the series connection between the adjacent solar cell elements has a stacked structure composed of the insulating member and the conductive member and the reverse bias voltage prevention bypass diode is disposed between the connection member comprising the insulating member and the conductive member and the conductive substrate. Therefore, the necessity of connecting the reverse bias voltage prevention bypass diode while positioning the solar cell elements apart from each other can be eliminated. Hence, the effective generating region of the solar cell module can be increased.

The use of the chip-type reverse bias voltage prevention bypass diode and the connection member which comprises the elongated insulating member and the conductive member will prevent projection of the solar cell module due to the presence of the reverse bias voltage prevention bypass diode. Further, reliability can be maintained for a long time because the encapsulant present adjacent to the reverse bias voltage prevention bypass diode can be freed from bubbles left therein. Since no connecting wiring is required to connect the reverse bias voltage prevention bypass diode to each of the solar cell elements, wiring breakage can be eliminated satisfactorily. Hence, reliability can be improved, material cost can be reduced and a process for establishing the connection can be omitted. In addition, short-circuits between the conductive member of the series connection member and the lower electrode of the solar cell element having the current-collecting electrode to which the conductive member of the connection member is connected can be prevented. Further, the conductive substrates of the solar cell elements can be freed from shortcircuits. Therefore, the necessity of positioning the solar cell elements away from each other by an excessively long distance can be eliminated. Hence, the non-generating region of the solar cell module can be reduced and the solar cell module can be manufactured easily.

Further, the manufacturing process can be simplified, automation facilitated and solar cell modules, the cost of each of which can be reduced, provided because the chip-type reverse bias voltage prevention bypass diode and the connection member comprising the insulating member and the conductive member can be formed into a sub-assembly.

Although the invention has been described in its preferred form with a certain degree of particularity, it is understood that the present discussion of the preferred form has been changed in the details of construction and the combination and arrangement of parts may be resorted to without departing from the spirit and the scope of the invention as hereinafter claimed.

What is claimed is:

1. A solar cell module comprising:
a plurality of solar cells formed on corresponding substrates;
a plurality of connection members for series electrically connecting each of the electrodes of said plurality of solar cells to an opposite polarity electrode of an adjacent solar cell, wherein
each said connection member is in the form of an elongated strip having a laminated structure composed of a transparent insulating member and a comb-shaped conductive member formed on portions of said insulating member.

2. A solar cell module according to claim 1, wherein one end of said connection member is positioned on a transparent electrode of each said solar cell and said comb-shaped conductive member is disposed in electrical contact with said transparent electrode.

3. A solar cell module according to claim 2, wherein a current-collecting electrode is disposed on said transparent electrode and said current-collecting electrode and said comb-shaped conductive member of said connection member are electrically connected to each other.

4. A solar cell module according to claim 1, wherein each said solar cell comprises a thin film semiconductor.

5. A solar cell module according to claim 1, wherein a portion of each said connection member has a bypass diode mounted thereon.

6. A solar cell module according to claim 5, wherein said bypass diode is a bare chip diode.

7. A solar cell module according to claim 5, wherein said diode portion and a series connection portion of said connection member are separated from each other by a cut-out portion of said connection member.

8. A solar cell module according to claim 1, wherein said conductive member has a volume resistivity of $1 \times 10^{-4}$ $\Omega$.cm or less.

9. A solar cell module according to claim 1, wherein said insulating member has a volume resistivity of $1 \times 10^{10}$ $\Omega$.cm or more.

10. A solar cell module according to claim 1, wherein said insulating member has a light transmissivity of 50% or more with respect to visible light.

11. A solar cell module according to claim 1, wherein said insulating member has a thickness of $20\mu$ to $200\mu$.

12. A solar cell module according to claim 1, wherein said insulating member is made of a material selected from a group consisting of polyester, polyimide, polyethylene, nylon, polymethacrylate, polycarbonate, polyethylene terephthalate, polyamide, polystyrene, and fluorine-containing resin.

13. A solar cell module according to claim 1, wherein said substrates is conductive and forms one of the electrodes of the corresponding solar cell.

14. A solar cell module according to claim 13, wherein each said substrate is made of a sheet material selected from a group consisting of stainless steel, aluminum, copper, and carbon.

15. A solar cell module according to claim 14, wherein each said substrate has a nickel-plated portion and said nickel-plated portion and said conductive member are electrically connected to each other.

16. A solar cell module according to claim 1, wherein a thermosetting adhesive agent is applied between said insulating member and said conductive member.

17. A method of manufacturing a series connected solar cell module comprising the manufacturing processes of:

electrically connecting an elongated connection member having a laminated structure composed of a comb-shaped conductive member formed on portions of a transparent insulating member to an electrode of a solar cell so as to form a sub-assembly; and sequentially stacking adhesive portions of said sub-assemblies of connection members and solar cells to effect series interconnection thereof.

* * * * *

UNITED STATES PATENT AND TRADEMARK OFFICE
CERTIFICATE OF CORRECTION

PATENT  : : 5,391,235

DATED  : February 21, 1995

INVENTOR  : YUJI INOUE

It is certified that error appears in the above-identified patent and that said Letters Patent is hereby corrected as shown below:

COLUMN 4

Line 23, "$1 \times 10^x$ Ω.cm" should read --$1 \times 10^{10}$ Ω.cm--.

COLUMN 5

Line 17, "cross sectional" should read --cross-sectional--.
Line 20, "FIGS. 5a and 5b" should read --FIGS. 5A and 5B--.
Line 56, "FIGS. 17a and 17b" should read --FIGS. 17(A) and 17(B)--.
Line 63, "FIGS. 19a and 19b" should read --FIGS. 19(A) and 19(B)--.

COLUMN 6

Line 4, "FIGS. 22a-22c" should read --FIGS. 22(A)-22(C)--.
Line 7, "FIG. 23" should read --FIGS. 23A and 23B--.
Line 19, "cross sectional" should read --cross-sectional--.
Line 26, "FIGS. 29a and 29b" should read --FIGS. 29A and 29B--.
Line 29, "FIGS. 30a and 30b" should read --FIGS. 30A and 30B--.
Line 32, "FIGS. 31a and 31b" should read --FIGS. 31A and 31B--.
Line 36, "FIGS. 32a and 32b" should read --FIGS. 32A and 32B--.

COLUMN 9

Line 19, "pm" should read --pn--.

UNITED STATES PATENT AND TRADEMARK OFFICE
CERTIFICATE OF CORRECTION

PATENT NO. : 5,391,235

DATED : February 21, 1995

INVENTOR : YUJI INOUE

It is certified that error appears in the above-identified patent and that said Letters Patent is hereby corrected as shown below:

COLUMN 14

Line 54, "be" should read --was--.

COLUMN 15

Line 51, "member-thus" should read --member thus--.

COLUMN 17

Line 11, "Collecting" should read --collecting--.

COLUMN 18

Line 55, "23," should read --FIGS. 23A and 23B--.

COLUMN 20

Line 37, "to" should read --so--.
Line 42, "to" should read --so--.

COLUMN 21

Line 52, "shortcircuits." should read --short-circuits.--.

COLUMN 22

Line 30, "to that" should read --so that--.
Line 31, "FIG. 32." should read --FIGS. 32A and 32B.--.

UNITED STATES PATENT AND TRADEMARK OFFICE
CERTIFICATE OF CORRECTION

PATENT NO. : 5,391,235

DATED : February 21, 1995

INVENTOR : YUJI INOUE

It is certified that error appears in the above-identified patent and that said Letters Patent is hereby corrected as shown below:

COLUMN 24

Line 7, "shortcircuits." should read --short-circuits.--.

Signed and Sealed this

Fourth Day of July, 1995

BRUCE LEHMAN

*Attest:*

*Attesting Officer*  *Commissioner of Patents and Trademarks*